(12) United States Patent
Bittner et al.

(10) Patent No.: US 10,001,631 B2
(45) Date of Patent: Jun. 19, 2018

(54) PROJECTION LENS FOR EUV MICROLITHOGRAPHY, FILM ELEMENT AND METHOD FOR PRODUCING A PROJECTION LENS COMPRISING A FILM ELEMENT

(71) Applicant: Carl Zeiss SMT GMBH, Oberkochen (DE)

(72) Inventors: Boris Bittner, Roth (DE); Norbert Wabra, Werneck (DE); Sonja Schneider, Oberkochen (DE); Ricarda Maria Schoemer, Zusmarshausen (DE); Hendrik Wagner, Aalen (DE); Christian Wald, Aalen (DE); Rumen Iliew, Oberkochen (DE); Thomas Schicketanz, Aalen (DE); Toralf Gruner, Aalen-Hofen (DE); Walter Pauls, Huettlingen (DE); Holger Schmidt, Aalen (DE); Matthias Roesch, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 174 days.

(21) Appl. No.: 14/454,939

(22) Filed: Aug. 8, 2014

(65) Prior Publication Data

US 2014/0347721 A1   Nov. 27, 2014
US 2017/0261730 A9   Sep. 14, 2017

Related U.S. Application Data

(63) Continuation of application No. PCT/EP2013/000382, filed on Feb. 8, 2013.
(Continued)

(30) Foreign Application Priority Data

Feb. 10, 2012   (DE) .................. 10 2012 202 057

(51) Int. Cl.
*G02B 17/08* (2006.01)

(52) U.S. Cl.
CPC ..... *G02B 17/0892* (2013.01); *G02B 17/0896* (2013.01)

(58) Field of Classification Search
CPC ........ G02B 5/208; G02B 1/115; G02B 5/285; G02B 1/118; G02B 5/0891;
(Continued)

(56) References Cited

U.S. PATENT DOCUMENTS 7,027,226 B2 * 4/2006 Goldberg ............. G02B 5/1833
                                                                 359/361
7,639,418 B2   12/2009 Banine et al.
(Continued)

FOREIGN PATENT DOCUMENTS

CN           1841209 A       10/2006
DE      102005016591 A1     10/2006
(Continued)

OTHER PUBLICATIONS

International Search Report in counterpart International Application No. PCT/EP2013/000382, dated Jul. 4, 2013.
(Continued)

*Primary Examiner* — Thomas K Pham
*Assistant Examiner* — Alberto Betancourt
(74) *Attorney, Agent, or Firm* — Edell, Shapiro & Finnan, LLC

(57) ABSTRACT

A film element of an EUV-transmitting wavefront correction device is arranged in a beam path and includes a first layer of first layer material having a first complex refractive index $n_1=(1-\delta_1)+i\beta_1$, with a first optical layer thickness, which varies locally over the used region in accordance with a first layer thickness profile, and a second layer of second layer material having a second complex refractive index $n_2=(1-$
(Continued)

$\delta_2$)+i$\beta_2$, with a second optical layer thickness, which varies locally over the used region in accordance with a second layer thickness profile. The first and second layer thickness profiles differ. The deviation $\delta_1$ of the real part of the first refractive index from 1 is large relative to the absorption coefficient $\beta_1$ of the first layer material and the deviation $\delta_2$ of the real part of the second refractive index from 1 is small relative to the absorption coefficient $\beta_2$ of the second layer material.

40 Claims, 9 Drawing Sheets

Related U.S. Application Data

(60) Provisional application No. 61/597,510, filed on Feb. 10, 2012.

(58) Field of Classification Search
CPC .............. G02B 13/1431; G02B 5/283; G02B 27/0043; G02B 17/0892; G02B 17/0896; G02B 17/808; G02B 5/0892; G02B 19/0095; G21K 1/062; G03F 1/22; G03F 7/70033; G03F 7/70; G03F 7/70191; G03F 7/70208; G03F 7/70216
USPC ........ 359/350–351, 357, 359–360, 577, 580, 359/582, 584, 586, 588–590, 601, 609, 359/613–614; 355/67, 71; 378/34–35, 378/145, 147, 156–159, 161
See application file for complete search history.

(56) References Cited

U.S. PATENT DOCUMENTS

| | | |
|---|---|---|
| 7,982,854 B2 | 7/2011 | Mann et al. |
| 8,558,988 B2 | 10/2013 | Vladimirsky et al. |
| 2003/0081316 A1 | 5/2003 | Goldberg et al. |
| 2005/0064299 A1* | 3/2005 | Lu ..................... B82Y 10/00 430/5 |
| 2005/0122589 A1* | 6/2005 | Bakker ................ G02B 1/11 359/591 |
| 2005/0248835 A1 | 11/2005 | Mann et al. |
| 2006/0033053 A1* | 2/2006 | Lee ..................... G03F 7/70008 250/504 R |
| 2006/0221316 A1 | 10/2006 | Yamamoto |
| 2007/0015067 A1* | 1/2007 | Amemiya .............. G02B 5/208 430/5 |
| 2008/0259439 A1* | 10/2008 | Shiraishi ................ B82Y 10/00 359/360 |
| 2009/0303450 A1* | 12/2009 | Hintersteiner ......... G03B 27/52 355/30 |
| 2010/0195076 A1* | 8/2010 | Mueller .................... G03F 1/64 355/67 |
| 2010/0239822 A1 | 9/2010 | Pelizzo et al. |
| 2011/0149262 A1* | 6/2011 | Van Herpen ........... B82Y 10/00 355/71 |
| 2012/0225375 A1* | 9/2012 | Mikami ................ B82Y 10/00 430/5 |

FOREIGN PATENT DOCUMENTS

| | | |
|---|---|---|
| DE | 102008041436 A1 | 4/2009 |
| JP | 2006279036 A | 10/2006 |
| JP | 2007088237 A | 4/2007 |
| JP | 2008270808 A | 11/2008 |
| JP | 2009124143 A | 6/2009 |
| JP | 2010097986 A | 4/2010 |

OTHER PUBLICATIONS

Office Action in corresponding German Application No. 10 2012 202 057.8, dated May 16, 2012, along with an English translation.
Office Action in corresponding Chinese Application No. 201380008896.1, dated Oct. 23, 2015, along with an English translation.
Office Action in corresponding Chinese Application No. 201380008896.1, dated Jun. 20, 2016, along with an English translation.
Office Action in corresponding Japanese Application No. 2014-555979, dated Oct. 19, 2016, along with an English translation.
Office Action in corresponding Japanese Application 2008288058, dated May 15, 2017, along with English Translation.
Office Action in corresponding Taiwanese Application 102105232, dated Jul. 10, 2017, along with English Translation.

* cited by examiner

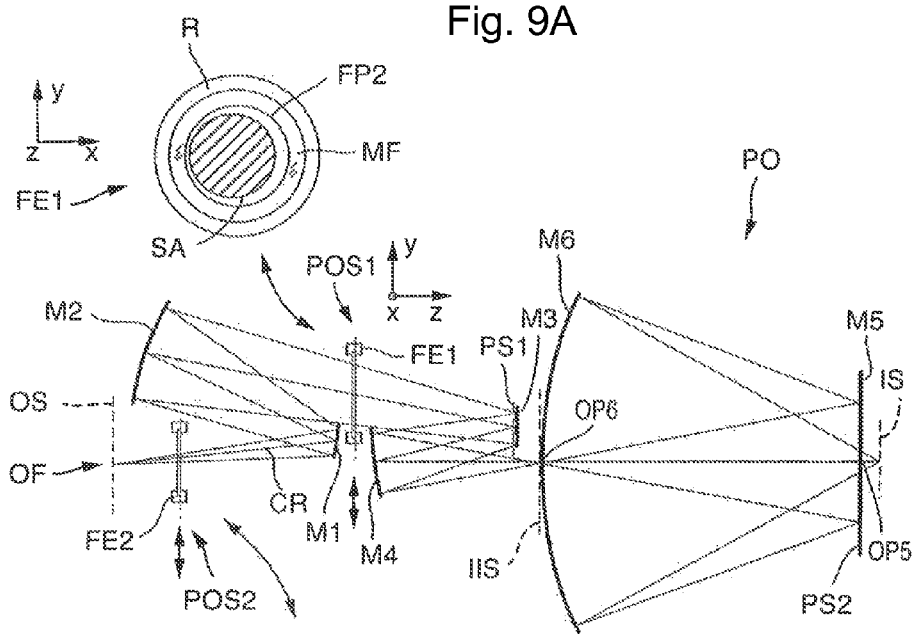
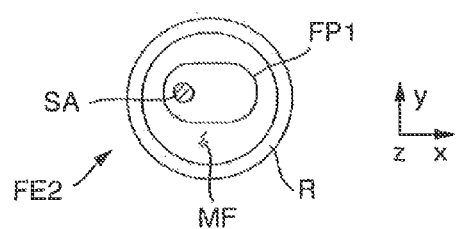
Fig. 9A
Fig. 9
Fig. 9B

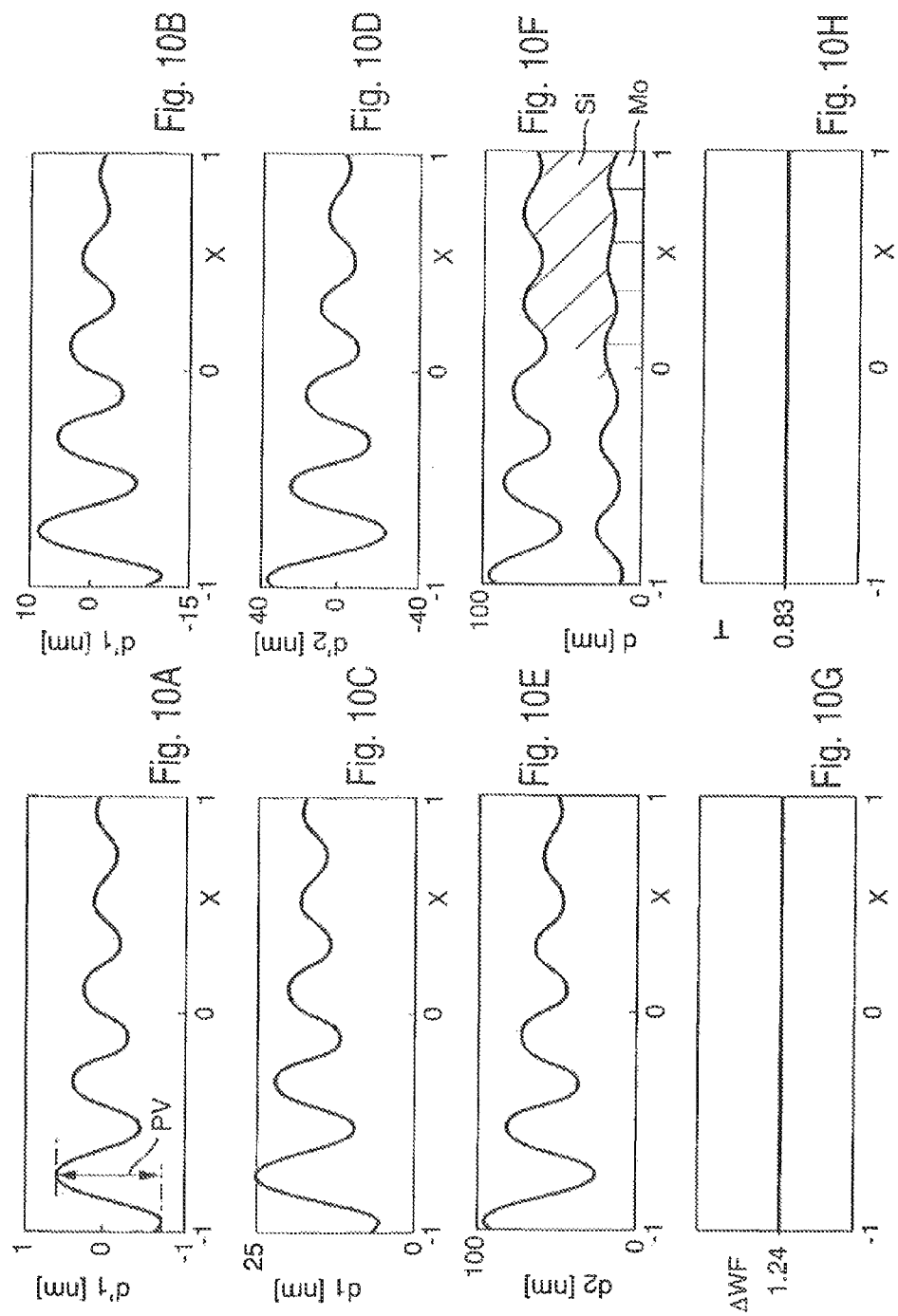

PROJECTION LENS FOR EUV MICROLITHOGRAPHY, FILM ELEMENT AND METHOD FOR PRODUCING A PROJECTION LENS COMPRISING A FILM ELEMENT

This is a Continuation of International Application PCT/ 2013/000382, with an international filing date of Feb. 8, 2013, which was published under PCT Article 21(2) in English, and the complete disclosure of which, is incorporated into this application by reference.

TECHNICAL FIELD AND BACKGROUND

The invention relates to a projection lens for imaging a pattern arranged in an object plane of the projection lens into an image plane of the projection lens with electromagnetic radiation having a working wavelength λ from the extreme ultraviolet range (EUV). Furthermore, the invention relates to a film element provided, in particular, for use in such a projection lens, and to a method for producing a projection lens containing a film element.

Nowadays predominantly microlithographic projection exposure methods are used for producing semiconductor components and other finely structured components. In this case, use is made of masks (reticles) or other patterning devices which carry or form the pattern of a structure to be imaged, e.g. a line pattern of a layer of a semiconductor component. The pattern is positioned in a projection exposure apparatus between an illumination system and a projection lens in the region of the object surface of the projection lens and illuminated with an illumination radiation provided by the illumination system. The radiation altered by the pattern passes as projection radiation through the projection lens, which images the pattern onto the substrate to be exposed, which is generally coated with a radiation-sensitive layer (resist, photoresist).

In order to be able to produce ever finer structures, in recent years projection lenses have been developed which operate with moderate numerical apertures and achieve an increase in the resolution capability substantially using the short wavelengths of the used electromagnetic radiation from the extreme ultraviolet range (EUV). In particular, wavelengths in the range of between 5 nm and 30 nm are used here.

Radiation from the extreme ultraviolet range (EUV radiation) cannot be sufficiently focused or guided with the aid of refractive optical elements, since the short wavelengths are greatly absorbed by the known optical materials that are transparent at higher wavelengths, or other materials. Therefore, mirror systems are used for EUV lithography. A mirror (EUV mirror) having a reflective effect for radiation from the EUV range typically has a substrate, on which is applied a multilayer arrangement having a reflective effect for radiation from the extreme ultraviolet range and having a large number of layer pairs comprising alternately relatively low refractive index and relatively high refractive index layer material and acting in the manner of a distributed Bragg reflector. Layer pairs for EUV mirrors are often constructed with the layer material combinations molybdenum/silicon (Mo/Si) and/or ruthenium/silicon (Ru/Si).

An EUV projection lens comprises a plurality of mirrors, e.g. four or six mirrors, having mirror surfaces which are arranged in a projection beam path between the object plane and the image plane in such a way that a pattern arranged in the object plane can be imaged into the image plane using the mirrors in a manner as free from aberrations as possible.

The rays of a projection beam that run between the object plane and the image plane form a wavefront. Deviations of the wavefront from a wavefront predefined by the specification can lead to imaging aberrations that cannot be afforded tolerance.

Projection lenses for EUV lithography demand very precise manufacture of the optical elements and a precise coating. What is problematic in this case is, inter alia, that the true state of the optical elements (in particular owing to the coating) can be measured sufficiently precisely only in the assembled state at the working wavelength (e.g. 13.5 nm). In this stage, often all that remains for a subsequent correction is very complex partial disassembly of the projection lens in order to rework mirrors. Beyond rigid-body movements are hardly any concepts that function in a sustained manner for the correction of lifetime effects.

OBJECTS AND SUMMARY

One object of the invention is to simplify the adjustment process for EUV projection lenses during production. A further object is to simplify a subsequent correction in the case of operationally governed changes in the imaging performance. A further object is to provide an EUV projection lens having very good imaging performance.

These objects are addressed and achieved by the invention, as described and claimed in a variety of formulations, encompassing, inter alia, a projection lens, a film element, and a method for producing a projection lens.

Advantageous refinements are described and claimed below. The wording of all of the claims is incorporated by reference into the present description.

The first layer and the second layer of the film element each have specific functions and act in a defined manner on the rays of the projection beam that pass through in order to change the profile of the wavefront in a predefinable manner. Preferably, the profile or the form of the wavefront is in this case altered such that the wavefront leading to image formation in the image plane, when the layers are present in the projection beam path, is closer to the wanted profile of the wavefront (desired wavefront) than in the absence of the layers. The wavefront is thus corrected with the aid of radiating through the layers.

Each of the layers (the first layer and the second layer) has, in the context of the wavefront correction, a sought or wanted primary function and a secondary function that is inevitably likewise present, which in each case result from the material choice for the first and for the second layer material, respectively. The material selection is effected, inter alia, on the basis of the complex refractive index of the materials or on the basis of the optical constants that determine the complex refractive index.

The complex refractive index n of a material can be described as a sum of the real part $(1-\delta)$ and the imaginary part iß of the refractive index in accordance with $n=(1-\delta)+i\beta$. In this notation, the dimensionless parameter $\delta$ describes the deviation of the real part of the refractive index n from the value 1. The dimensionless parameter ß is the absorption coefficient for the purposes of this application.

In the case of the first layer material, the deviation of the real part of the first refractive index from 1 is greater than an absorption coefficient, wherein the difference between these two values should generally be as large as possible (i.e. $\delta_1 \gg \beta_1$). What can thereby be achieved is that the first layer material has a relatively great influence on the phase or phase delay of the rays of the projection beam that pass through, while at the same time only relative little intensity is absorbed. In this case, the extent of the phase delay and of the absorption is proportional to the (local) layer thickness which is present at the respective radiating-through location and which is defined by the first layer thickness profile. Since the first layer has a location-dependent, relatively great effect on the phase of the radiation passing through, while at the same time the absorption is influenced only relatively little, likewise in a location-dependent manner, the (wanted) primary function of the first layer consists in introducing a location-dependent phase delay, while the (unavoidable) secondary function consists in slightly influencing in a location-dependent manner the intensity of the radiation passing through. On account of its primary function, the first layer is also designated hereinafter as "wavefront correction layer".

An opposite relation between the deviation of the real part of the first refractive index from 1 and the absorption coefficient is present in the case of the second layer material. Here the absorption coefficient should be as large as possible with respect to the deviation (i.e. $\delta_2 \ll \beta_2$). The primary function of the second layer consists in bringing about a location-dependent attenuation of the intensity of the radiation passing through, wherein the extent of the attenuation can be set by way of the course of the second layer thickness profile. The (unavoidable) second function consists in the fact that the second layer also has a certain influence on the phase of the radiation passing through. However, this influence is relatively small on account of the relatively small deviation of the real part of the second refractive index from the value 1. On account of its primary function, the second layer is also designated hereinafter as "transmission correction layer".

A location-dependent transmission correction which acts in the region of a pupil plane is also designated here as "apodization". The term "apodization" thus designates a location-dependent intensity reduction or location-dependent transmission losses in the region of a pupil plane of the projection lens.

By contrast, a location-dependent transmission correction which acts in the region of a field plane Fourier-transformed with respect to a pupil plane primarily influences the homogeneity of the illumination in the image field or the field uniformity.

Through targeted control of the first and second layer thickness profiles during the production and/or during a later processing of the first layer and/or of the second layer, the combination of first layer and second layer can correct in a location-dependent manner, in a wanted way, the profile of the wavefront of a beam passing there-through, wherein at the same time the local profile of the intensity attenuation can also be set in a targeted manner. In the case of the combination of first layer and second layer, therefore, one layer can respectively at least partly compensate for the unwanted secondary function of the other layer, such that it is possible to introduce a wavefront correction with the layer combination, without at the same time introducing uncontrollable location-dependent transmission losses.

The layer thicknesses of the first layer and of the second layer (and, if appropriate, of further layers of one or more films of a film element) are in this case so small altogether that a predominant proportion of the EUV radiation impinging on the layers in an optical used region, that is to say at least 50%, is transmitted through the layers.

A film-based wavefront correction device comprising a (at least one) first layer and a (at least one) second layer which are designed in the manner described introduces, for the purpose of wavefront correction, into the projection beam path in addition to the mirrors of the projection lens optically active layers which, although they introduce unavoidably small transmission losses, nevertheless at the same time bring about a targeted location-dependent intervention in the wavefront of the projection radiation. This wavefront correction can be effected without the need to make changes to the mirrors of the projection lens in terms of their position and/or surface form. With the aid of the wavefront correction device, a correction of lifetime effects can also be performed after original mounting and adjustment.

As a result of the use of film technology, in some embodiments it is possible for the film element to have a transmittance of at least 70% of the impinging EUV radiation in the entire optical used region. In this case, the transmission that can actually be obtained is primarily dependent on the total thickness irradiated and the layer materials used therein and cannot be arbitrarily reduced without jeopardizing the mechanical stability of the film. However, embodiments are possible wherein the transmittance in the entire optical used region is above 80% or above 85%. Transmittances will normally not exceed 90% since extremely thin layer thicknesses would be required for this purpose, which could be critical for the stability of the film.

Moreover, the transmittance of the film element is influenced not least by the peak-to-valley value of the wavefront correction to be carried out. A larger peak-to-valley value generally leads to a greater change in the phase effect at at least one field point, which, as described above, as secondary function induces an enlarged change in the transmission behavior at said point.

In order to ensure a wanted wavefront correction substantially without influencing the polarization state of the transmitted radiation, preferred embodiments provide for the film element or the at least one film to be arranged and oriented in the beam path in such a way that the entire radiation of the projection beam is incident on the optical used region with angles of incidence of less than 20°, in particular less than 10°, and the film element or the at least one film accordingly passes through perpendicularly or largely perpendicularly or at a relatively small angle with respect to the film normal direction. As a result, polarization-selective effects can be largely avoided.

A film element can be arranged at different positions in the projection beam path with regard to the wanted correction effect. In some embodiments, in the projection lens, at least one pupil plane lies between the object plane and the image plane, and the film element is arranged in the pupil plane or optically in proximity to the pupil plane. This is designated hereinafter as "arrangement in proximity to the pupil". The film element is then arranged at a position which is substantially Fourier-transformed with respect to the position of the object plane and the image plane. In the case of an arrangement in proximity to the pupil, all rays of the projection beam which are incident from the object field at a specific ray angle of the projection lens impinge on the film element substantially in the same local region within the optical used region. This applies to all object field points independently of the position thereof in the object field. A film element arranged in or in proximity to a pupil plane thereby makes it possible to correct a common offset of the wavefront over all field points.

It is also possible to arrange a film element in optical proximity to the object plane or the image plane. If an intermediate image plane lies between the object plane and the image plane, the film element can also be arranged in the intermediate image plane or in optical proximity to the intermediate image plane. Positions in optical proximity to the object plane, the image plane or, if appropriate, an intermediate image plane are designated as "arrangement in proximity to the field" or as arrangement in proximity to a field plane. In the case of an arrangement in proximity to the field, different locations within the optical used region of the film element act differently on different field points, such that, if appropriate, a field profile of wavefront aberrations can be corrected.

A film element in optical proximity to a field plane can be arranged e.g. in the region between the object plane and the first mirror.

By way of example, the subaperture ratio SV can be used for quantifying the position of an optical element or a plane in the beam path.

In accordance with a clear definition, the subaperture ratio SA of an optical surface of an optical element in the projection beam path is defined as the quotient between the subaperture diameter $D_{SA}$ and the optically free diameter $D_{CA}$ in accordance with $SA:=D_{SA}/D_{CA}$. The subaperture diameter $D_{SA}$ is given by the maximum diameter of a partial surface of the optical element which is illuminated with rays of a beam emerging from a given field point. The optically free diameter $D_{CA}$ is the diameter of the smallest circle about a reference axis of the optical element, wherein the circle encloses that region of the surface of the optical element which is illuminated by all rays coming from the object field.

In a field plane (e.g. object plane or image plane), SV=0 accordingly holds true. In a pupil plane, SV=1 holds true. Consequently, planes "in proximity to the field" have a subaperture ratio that is close to 0, while planes "in proximity to the pupil" have a subaperture ratio that is close to 1. In general, in the case of a film element arranged in proximity to the pupil, the subaperture ratio is preferably between 0.5 and 1, in particular in the range of between 0.7 and 1. In the case of a film element arranged in proximity to the field, the subaperture ratio is preferably between 0 and 0.5, in particular in the range of between 0 and 0.3.

There are various possibilities for the relative arrangement of the first layer and the second layer.

The first layer can be arranged relative to the second layer such that radiation passes firstly through the first layer and then through the second layer. An opposite arrangement is also possible.

It is possible to provide a film element having a multilayer film comprising both the first layer and the second layer. In this case, the first layer and the second layer are situated at the same multilayer film, as a result of which a relative orientation and local assignment of the layers become particularly precise. Moreover, an integration in a common multilayer film affords the advantage that transmission losses can be kept particularly small since both layers contribute to the mechanical stability of the same multilayer film.

It is also possible to provide more than one film, wherein the first layer is mounted on a first film and the second layer is mounted on a second film, which is physically separate from the first film. This variant affords the advantage, inter alia, that the first layer thickness profile and the second layer thickness profile can be produced independently of one another and, if appropriate, also subsequently changed more simply. One or both of the films can be embodied as multilayer films.

If appropriate, a film element can also comprise a single-layer film, wherein a film is formed exclusively by the first layer or exclusively by the second layer. Such a single-layer film has a non-uniform layer thickness, the layer thickness then simultaneously being the entire film thickness. The single-layer film can be combined with a further single-layer film (composed of the respective other layer material) or with a multilayer film.

As a result of contact with the ambient atmosphere or operation or contaminations of the ambient atmosphere, the original single-layer film in the strict sense can give rise to a multilayer film which preferably has on the surfaces thereof thin areal or punctiform plies of different materials such as, for example, oxidation products of the single-film layer ply material. Further possible additional layers that can result from the contact of the film layer with the ambient atmosphere are carbon deposits or deposits composed of volatile metal hydrides. That also applies to the interfaces between multilayer films and the surrounding atmosphere.

In order to ensure that the wanted local assignment of the mutually assigned regions of the first layer and of the second layer through which radiation is to pass is sufficiently precise, a very small optical and/or geometrical distance between the first and the second multilayer film (or single-layer film) is advantageous.

The geometrical distance should generally be less than ten centimeters, in particular less than one centimeter. Distances in the range of from a few millimeters down to one millimeter and, if appropriate, less than that can be advantageous.

The optical distance should preferably be chosen such that in the region of the first and of the second film (multilayer film or single-layer film) the subaperture ratio is substantially identical or very similar, such that both multilayer films from an optical standpoint "see" substantially the same projection ray.

In particular, the subaperture ratio of the first and second films should deviate from one another by less than 0.05 or less than 0.01.

In principle, it is advantageous if a second film is situated optically in proximity to the first film or if it is arranged at a distance from the first film at a position that is optically conjugate with respect to the position of the first film. In the case of the projection lens wherein an intermediate image is generated between the object plane and the image plane, by way of example it is possible to arrange a first film in the region of a first pupil surface between object plane and intermediate image and a second film at the region of a second pupil surface between the intermediate image and the image plane.

On the other hand, in some cases it may be advantageous to position a film element in the pupil or in proximity to the pupil and a further film element in the field or in proximity to the field. What can thereby be ensured is that both field-constant and field-varying wavefront disturbances can be corrected.

For the material choice of the first layer material and of the second layer material, the following considerations may be useful individually or in combination.

By way of example, it may be helpful to define an efficiency ratio $V_i=\delta_i/\beta_i$, for the first layer material and the second layer material. The efficiency ratio is a qualitative measure of the suitability of a layer material for the respective primary function of the layers. In the case of the first layer material, the first efficiency ratio $V_1=\delta_1/\beta_1$ should be greater than 1, preferably greater than 5, ideally even greater than 10. Such layer materials are particularly effective for the wanted wavefront contour with at the same time a relatively small location dependence of the transmission losses. By contrast, the second efficiency ratio $V_2=\delta_2/\beta_2$ should be less than 1, wherein values of less than 0.6 or even less than 0.2 are regarded as particularly advantageous. In this case, a location-dependent intensity attenuation that is relatively greatly dependent on the layer thickness can be obtained with a small influence on the wavefront.

In advantageous embodiments, the ratio $V_1/V_2$, that is to say the ratio of the respective efficiency ratios, is greater than 2. Preferably, this ratio should be greater than 10, ideally even greater than 20. Where possible, $V_1/V_2>50$ can also hold true. If these conditions are met, then the respective layer materials are particularly well suited to their task (wavefront correction with small transmission losses or transmission correction with a small influence on the wavefront). The absolute layer thicknesses for obtaining the desired function can thereby be kept small, as a result of which in turn the total transmission can achieve relatively high values.

Suitable material combinations are dependent, in principle, on the working wavelength. The working wavelength is preferably in the wavelength range of 5 nm to 20 nm.

For working wavelengths from the wavelength range of 7 nm to 20 nm, in particular for wavelengths around approximately 13.5 nm, the first layer material can preferably be selected from the group: ruthenium (Ru), zirconium (Zr), molybdenum (Mo), niobium (Nb), chromium (Cr), beryllium (Be), gold (Au), yttrium (Y), yttrium silicide ($Y_5Si_3$), zirconium silicide ($ZrSi_2$) or from a material composition which predominantly, in particular to the extent of at least 90%, consists of one of these materials.

The second layer material is preferably selected from the group silicon (Si) and germanium (Ge) or a material composition which predominantly (e.g. to the extent of at least 90%) consists of one of these materials.

If working wavelengths of between approximately 6 nm and approximately 7 nm are used, there are suitable for the first layer for example the materials: $NbOB_4C$, $NbO_2$, $Nb_2O_5$, $RuO_4$, $MoO_2$, $Rh_2O_3$, C, Te, In, Ba, Sn, $RuO_2$, $MoO_3$, La and for the second layer the materials Y or Rb or material compositions that predominantly (e.g. to the extent of at least 90%) consist of one of these materials.

With regard to the total transmission, it should also be taken into consideration that said total transmission is dependent on the extent of the wavefront correction to be made. If molybdenum (Mo), for example, is used as material for the first layer, a correction of the wavefront PV value of 1 nm is "purchased" with approximately 7.5% transmission variation and a corresponding transmission loss. If only smaller wavefront aberrations are to be corrected, then correspondingly smaller layer thicknesses suffice, as a result of which the transmission variations and the transmission losses also become smaller.

The extent of a wavefront correction that can be obtained by local variation of the first layer thickness is dependent, inter alia, on the so-called PV ratio between the largest local value and the smallest local value of the first optical layer thickness in the optical used region. In preferred embodiments, said PV ratio is in the range of 2 to 6. If the PV ratio becomes significantly less than 2, then normally only relatively slight wavefront corrections can be achieved, and so the required outlay and the benefit that can be obtained should be weighed up in relation to one another. By contrast, if the PV ratio becomes significantly greater than 6, then the maximum local layer thicknesses generally become so large that the accompanying transmission losses can be critical.

Corresponding considerations may be helpful with regard to the layer thickness variation of the second layer. Here, too, the PV ratio should preferably be in the range of 2 to 6. If silicon, for example, is used as second layer material, layer thicknesses of between approximately 20 nm and approximately 70 nm will often suffice in order to obtain a good compromise between obtainable transmission correction and introduced transmission losses.

In both cases, the calculation of the PV ratios is based on a material-dependent minimum layer thickness which should not be undershot.

Embodiments wherein the second layer thickness profile is complementary to the first layer thickness profile are particularly expedient. Here the term "complementary" should not understood strictly in the mathematical sense, but rather in the sense that the first layer and the second layer preferably tend to have mutually opposite local layer thickness distributions. In particular, the situation can be such that the second layer thickness profile has local maxima at positions at which the first layer has local minima of the first layer thickness. A transmission correction layer accordingly preferably has "peaks" where the associated wavefront correction layer has "valleys". What can thereby be achieved for the optical effect is that the location-dependent variation of the transmission losses that is introduced by the first layer can be at least partly compensated for by the wavefront correction layer with the aid of the second layer thickness. In the limiting case this can mean that the transmission loss of a film element comprising first and second layers is substantially uniform over the entire optical used region and only a wavefront correction that varies in a location-dependent manner remains. As a result of the complementary layer thickness profiles, what can be achieved, moreover, is that the total thickness of the film element varies only relatively little in the optical used region, such that an approximately uniform film thickness can be achieved, which can be advantageous for the mechanical stability, inter alia.

In some cases it can be permissible for the transmission of the projection lens to be allowed to have certain fluctuations of, for example, 0.1% or else 1% or even 10%. This fluctuation range can be used to provide the transmission correction layer with a smaller local variation. This can be advantageous if the transmission correction layer is a material that can be provided with a correction profile relatively poorly (for example Si).

With regard to the effectiveness for the wavefront correction it can furthermore be advantageous if the layer thicknesses of the first layer and of the second layer are designed such that the film, in a region of maximum wavefront change, brings about a wavefront change of at least 3% of the working wavelength. For a working wavelength of 13.4 nm, this would correspond for example to a minimum wavefront correction of approximately 0.4 nm.

In order to achieve an effective wavefront correction with as little variation of the transmission as possible, many embodiments provide for the second layer thickness to be greater than the working wavelength at at least one position in the optical used region. By virtue of this feature, inter alia, the layer systems provided for wavefront correction can be clearly distinguished from known multilayer mirror layers in which the layer thicknesses of the individual layers are typically only fractions of the working wavelength, as in the case of quarter-wave layers, for example.

Typically, a film of the type under consideration here has a first film surface, a second film surface and a film thickness measured between the first and second film surfaces of less than 1 μm, wherein the film thickness is preferably 200 nm or less, in particular 100 nm or less. In the case of film thicknesses of 30 nm or less or even 25 nm or less, problems with the mechanical stability of the multilayer film can occur. A film thickness range of between 200 nm and 25 nm generally affords a good compromise between mechanical stability, on the one hand, and sufficiently great wavefront correction with tenable transmission losses, on the other hand.

Film elements of the type under consideration here are generally provided for long-term use, such that an optical function that is largely unchanged even over relatively long periods of time (if appropriate several years) should be ensured. In some embodiments, a film has at at least one film surface an outer protective layer consisting of a protective layer material that is more resistant to ambient influences than an inner layer directly adjacent to the protective layer. An appropriate protective layer material is ruthenium (Ru) or rhodium (Rh), for example, which is occasionally also used as a so-called "cap layer" in multilayer mirrors for the EUV range. Carbon (C), iridium (Ir) and silicon (Si) are also suitable as protective layer materials. It can be expedient if the protective layer predominantly consists of an oxide or a nitride, in particular of $Si_3N_4$ (silicon nitride). This material exhibits low absorption relative to ruthenium or rhodium, such that the transmission losses can be kept small. Preferably, both film surfaces are equipped with an outer protective layer. The protective layer can be formed by an oxide or nitride of the outer layer.

In many cases it is advantageous if a multilayer film comprises as few individual layers as possible, such that transmission losses and interface effects can be kept small. In preferred embodiments, the multilayer film comprises only a single first layer and/or only a single second layer. It is thereby possible to ensure the wanted optical functions with the highest possible transmission.

It can be advantageous if a multilayer film comprises at least one antireflection layer which has a reflection-reducing effect for the working wavelength. The transmission can then thereby be improved. The antireflection layer can have, for example, an optical layer thickness of the order of magnitude of half the working wavelength. An antireflection layer can be provided, for example, in a manner directly adjoining a first layer and/or a second layer.

Alternatively, or in addition, the multilayer film may comprise one or more functional layers providing additional functionality. For example, a filter layer (or filter layers) may be provided on one film surface or both film surfaces to reduce or remove less desirable wavelengths from the projection radiation. The filter layer may comprise a multilayer or a diffraction grating.

The first and second layers can directly adjoin one another. It is also possible for at least one intermediate layer to be arranged between the first layer and the second layer. The intermediate layer can be an antireflection layer, for example. Depending on the first and second layer materials, it can also be advantageous to insert as intermediate layer a diffusion barrier layer, which can consist, for example, of C, $B_4C$, $Si_xN_y$, SiC, $Mo_2C$, $MoSi_2$, $Y_5Si_3$ or $Nb_4Si$ or of a composition comprising one of these materials. Said layer can also be designed as an antireflection layer.

A multilayer film comprises two or more individual layers. Multilayer films of the type under consideration here are generally intended to cause the smallest possible transmission losses in the projection beam path. Therefore, in many cases it is advantageous if the multilayer film comprises fewer than 10 further layers in addition to the first layer and the second layer. The multilayer film can comprise between 5 and 9 individual layers, for example.

The first layer and/or the second layer can have a largely homogeneous layer construction such as results from the coating method used for production. In many cases, the first layer and/or the second layer will predominantly or completely have an amorphous layer structure. For stability reasons, it may be expedient to use special measures for avoiding a crystallization of the layer material. For this purpose, in particular, it may also be expedient to construct the first layer and/or the second layer with a heterogeneous layer structure. In the case of first layers based on molybdenum, in particular, it may be expedient, depending on the required layer thickness, to introduce in the first layer an inner layer structure in which relatively thick partial layers composed of molybdenum are separated by a crystallization stop layer which is very thin in comparison therewith and which is substantially without an optical function. In some embodiments, the layer thickness of the crystallization stop layer is less than 1 nm, while the layer thickness of the adjoining molybdenum partial layer can be more than twice or more than five times or more than 10 times as thick. In the design of the layer thicknesses, attention should be given to ensuring that no reflective effect arises as a result of the sequence of crystallization stop layers and base material layers. This can be achieved, for example, by the individual partial layers having non-uniform layer thicknesses and/or by the optical distance between the boundary layers deviating significantly from the multiple of $\lambda/4$.

The dimensions of the film element or of the optical used region can be adapted to the cross section of the projection beam to be influenced at the respective installation location. In some embodiments, the optical used region has a smallest diameter of 50 nm or more. The smallest diameter can be, in particular, 100 nm or more or 120 nm or more or even 150 nm or more. These relatively large used diameters make possible, in particular, applications in the region of a pupil plane in the beam path of the projection lens.

In order to ensure the required mechanical stability of the film element over long periods of time, some embodiments provide for the film element to have a lattice-like supporting structure which, in the optical used region, is in contact with the multilayer film and stabilizes the latter. The lattice-like supporting structure can have for example a honeycomb structure having struts which form hexagonal or other polygonal openings (e.g. triangular or quadrilateral, square or rectangular openings). The diameter of the openings can be for example of the order of magnitude of less than 1 mm, e.g. less than 300 μm and/or between 100 μm and 200 μm.

A stabilizing structure, such as a honeycomb structure, may be generated on a film by embossing so that stabilizing supporting portions consist of the film material.

Film elements having honeycomb-like supporting structures are known from U.S. Pat. No. 7,639,418 B2, for example, and are used therein as "spectral purity filter" in the region of the EUV light source of a projection exposure apparatus. The U.S. Pat. No. 7,982,854 B2 describes relatively thin polarization beam splitting elements in film form which can be mechanically stabilized with a perforated support structure. These polarization-optical elements are arranged obliquely in the beam path in such a way as to achieve a polarization-selective effect.

Alternatively, or in addition, thermal stability of a film element may be improved by specific measures. In some embodiments a lattice-like supporting structure which, in the optical used region, is in contact with the multilayer film may be made of a material having a heat conductance significantly larger than the heat conductance of the film materials in order to improve heat dissipation from regions of the film element exposed to EUV radiation. The lattice structure or struts thereof may be made of a metallic material and/or a carbon based material, for example. Copper (Cu), Nickel (Ni), graphene or carbon nano tubes (CNT) or combinations thereof may be used to form the heat conducting lattice. Lattice dimensions and shapes may be similar as described above.

For use in the projection lens, provision is preferably made of film elements which have a frame that supports the film (single-layer film or multilayer film) in such a way that the film is self-supporting in the optical used region. All frame elements therefore lie outside the optical used region and, as a result, cannot disturb the imaging.

In preferred embodiments, the film element can be incorporated into the projection beam path or removed from the latter, without demounting mirrors of the projection lens. As a result, the outlay for the wavefront correction with the aid of the film element can be kept particularly low. That can be achieved structurally by virtue of the fact that the projection lens has a holding structure for retaining the mirrors at their position in the projection beam path and the film element is arranged on a changeable holder, which is movable relative to the holding structure, in such a way that the film element can optionally be arranged in the projection beam path or outside the projection beam path by movement of the changeable holder. As a result, the original adjustment and maintenance work required later, if appropriate, become particularly simple. There can be provided on the projection lens for each planned installation location a corresponding access shaft for positioning the film element in the beam path of the projection lens.

Exchangeability of a film element may be useful in several ways. An exchangeable film element may be optionally brought into or removed out of the projection beam path. A first film element may be exchanged for a second film element having a different effect on the wavefront than the first film element. Imaging characteristics of a projection lens may thereby be altered as required for a particular application. In some cases this may be achieved without altering the positions and/or shapes of the mirrors. A projection lens may be provided with a set of different film elements which the end user may use to adapt imaging properties of a projection lens to a particular user case as required. For example, film elements may be exchanged depending of an illumination setting set in an illumination system to image properly a specific pattern.

A film element (comprising a film and a frame holding the film) may be exchanged for another film element, which typically has the same type of frame, but a different film. Alternatively, a changeable holder including a film element may be exchanged for another changeable holder with or without film element.

For the local profile of the layer thicknesses of the first and second layers there are no fundamental restrictions as long as overall a sufficient transmission of the film element is ensured. A rotationally symmetrical layer thickness profile or a radially symmetrical layer thickness profile or a layer thickness gradient running transversely in the wave used region is therefore possible. As necessary, in particular systematic aberrations can thus be corrected.

In preferred applications, however, film elements are used for the correction of the residual aberrations in projection lenses, such that in preferred embodiments the layer thickness profiles is generally able to be described only approximately by a superposition of higher-order Zernike functions, the latter generally arising depending on random manufacturing fluctuations at the projection lenses. Typically, by way of example, the first layer has in the optical used region a layer thickness profile having neither a mirror symmetry nor a radial symmetry or a rotational symmetry.

All suitable manufacturing methods can be used for producing the layer thickness profiles or the layers having locally varying layer thicknesses. The non-uniform layer thickness can be produced directly during the production of the layers by suitable method implementation during the coating method, for example by using a suitable masking method in order to produce a material flow of the coating particles to locally different extents. It is also possible for a layer that has already been produced to be reworked in order thereby to alter the profile of the layer thickness. By way of example, material removals to locally different extents can be produced by ion-assisted material removal (ion beam figuring, IBF), in order e.g. to produce the wanted, if appropriate asymmetrical, layer thickness profile of the first layer and/or of the second layer proceeding from a starting layer of uniform thickness or a starting layer having a rotationally symmetrical layer thickness profile.

When producing a projection lens using at least one wavefront-correcting film element, the following procedure can be adopted, for example. Firstly, the imaging mirrors provided for the projection lens are positioned at their provided positions in the holding structure in such a way that the mirror surfaces are arranged in a projection beam path between object plane and image plane in such a way that an imaging can be effected between object plane and image plane. In addition, at least one film element is installed at a predefined installation location within the projection beam path, for example in the region in optical proximity to a pupil plane.

On this projection lens, firstly the customary adjustment operations are then performed, which can include, for example, rigid-body movements of individual mirrors and/or manipulator-supported deformations of individual mirrors. With these adjustment operations it is possible to attempt to bring the generated wavefront as close as possible to the wanted specification. In this case, the wavefront aberrations of the projection lens are determined if appropriate multiply by measurement. By way of example, interferometric measurements can be used for this purpose.

After this first adjustment phase, there generally remain in the projection lens residual aberrations which could no longer be corrected or could only be corrected with considerable outlay using manipulations on the mirrors.

On the basis of the measured wavefront aberrations, a location-dependent wavefront correction for the correction location in the projection beam path, at which the (at least one) film element is situated, is then calculated from the measured wavefront aberrations.

The required wavefront corrections are then used to calculate the way in which the layer thickness profile of the first layer and/or of the second layer has to be altered in order to obtain the wanted wavefront correction.

This is followed by the completion of the film element with the wanted layer profiles for the first layer and the second layer. Material-removing and/or material-establishing methods can be used in this case.

This is followed by renewed installation of the altered (processed) film element and a further determination of the wavefront aberration of the projection lens including the now modified film element. The process of processing the film element and subsequent measurement can be repeated if appropriate multiply until the projection lens including the film element adapted thereto fulfills the predefined specification.

One possibility for the stepwise (iterative) completion of the film element consists in firstly applying only one support layer or a plurality of support layers and the first layer, which makes the significant contribution to the wanted wavefront correction. This is followed by the installation and the measurement jointly with the film element and, on the basis thereof, the calculation of a target layer thickness profile for the first layer taking account of the optical effect of a second layer to be applied later.

Afterward, the first layer is then processed locally differently for example with ion irradiation (ion beam figuring) such that the wanted first layer thickness profile is present. The second layer having the calculated locally varying layer thickness is then applied. The film element thus completed further is then installed again at the provided location and a further measurement is effected in order to check whether the film element affords the wanted wavefront correction. If this is not the case, a further material-removing processing, this time of the second layer, can be effected in order to eliminate possible residual aberrations. This step can be repeated if appropriate multiply. If the first layer and the second layer then jointly have the wanted optical effect, if appropriate wanted further layers, for example an outer protective layer, can be applied in order to complete the film element.

Alternatively, it is also possible to start from an unprocessed raw layer stack comprising an applied first layer, which is accessible from one side for the ion irradiation (ion beam figuring, IBF), and a second layer, which is accessible from another side (generally opposite the first side) for the ion irradiation. Consequently, from one side it is then possible to carry out one or more processing loops in order to attain the desired layer surface of one layer. From the other side it is likewise possible to carry out one or more processing loops in order to attain the desired layer surface of the other layer.

The film element is then installed at the installation location provided, such that the projection lens equipped with the film element has only the small residual aberrations that are regarded as acceptable.

An acceptance measurement can be effected for example preferably with a film element in the projection beam path. A measurement for the purpose of producing a suitably surface-processed correction element (film element) can be effected with an already installed (and for example exchangeable) film element or without the latter or with a non-surface-processed film element having a constant layer thickness.

The invention also relates to a method for producing a projection lens of a microlithography projection exposure apparatus comprising:
mounting a plurality of mirrors at provided positions in such a way that mirror surfaces are arranged in a projection beam path between the object plane and the image plane such that a pattern arranged in the object plane can be imaged into the image plane by the mirrors,
determining the wavefront aberrations of the projection lens;
calculating a location-dependent wavefront correction for the installation location from the wavefront aberrations of the projection lens;
processing a film element in such a way that the wavefront correction is effected by the film element if the film element is inserted into the projection beam path at the installation location;
installing the processed film element at the installation location.

In this case, therefore, the projection lens is firstly measured without a film element.

The method can also be carried out such that, prior to determining the wavefront aberrations, a film element is installed at the predefined installation location within the projection beam path, and after determining the wavefront aberrations, the film element is removed from the projection beam path and is then processed.

One foil element or more foil elements as described in the present specification may also be utilized to influence the wavefront in a projection lens designed for or incorporated into an optical mask inspection system for inspecting portions of a reflective mask (reticle) using EUV radiation. While a projection lens configured for use in a projection exposure apparatus for microlithography typically is a demagnifying optical imaging system, a projection lens configured for use in a mask inspection system typically is a magnifying optical imaging system generating an image which is larger than the object. Patent application US 2012/140454 A1 discloses examples of magnifying projection lenses configured for use in a mask inspection system which could be equipped with one or more foil elements according to the present disclosure. A foil element may be permanently installed or exchangeable. The term "projection lens" as used in this specification shall encompass both magnifying and demagnifying optical imaging systems.

The above and further features are evident not only from the claims but also from the description and from the drawings, wherein the individual features can in each case be realized by themselves or as a plurality in the form of subcombinations in an embodiment of the invention and in other fields and can constitute advantageous and inherently protectable embodiments. Exemplary embodiments of the invention are illustrated in the drawings and explained in greater detail below.

BRIEF DESCRIPTION OF THE DRAWINGS

FIGS. 1 and 1A show components of an EUV microlithography projection exposure apparatus in accordance with one embodiment of the invention;

FIG. 3 shows some layer materials suitable for the construction of wavefront correction films in a $\delta$-$\beta$ diagram of the complex refractive index, wherein

FIGS. 9, 9A and 9B show components of an EUV microlithography projection exposure apparatus in accordance with another embodiment of the invention; and FIGS. 10A-10H show computational results for various profiles obtained in accordance with an embodiment of the invention.

DETAILED DESCRIPTION OF EXEMPLARY EMBODIMENTS

Figure 1:
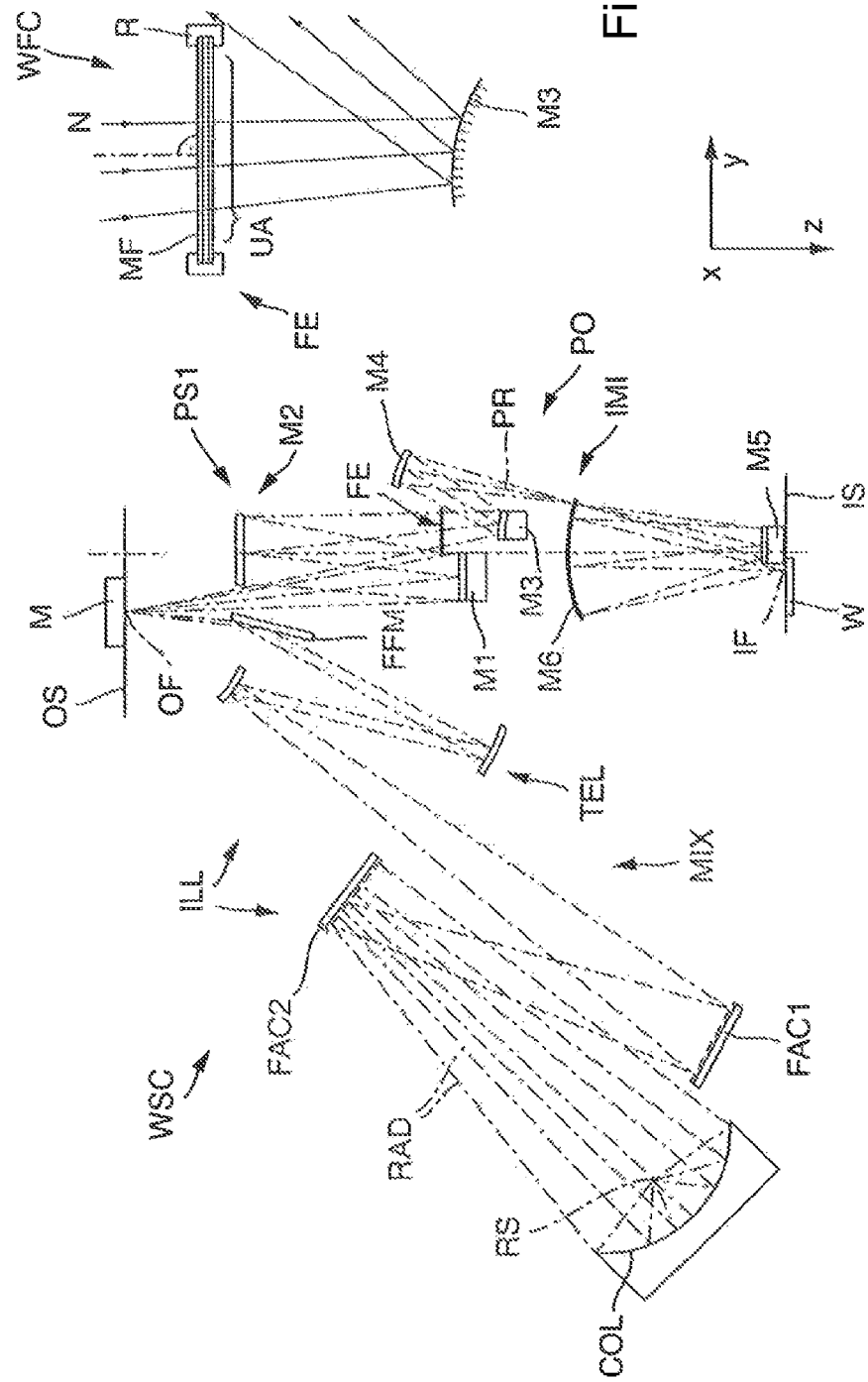

FIG. 1 shows optical components of an EUV microlithography projection exposure apparatus WSC in accordance with one embodiment of the invention. The EUV microlithography projection exposure apparatus serves for the exposure of a radiation-sensitive substrate W, arranged in the region of an image plane IS of a projection lens PO, with at least one image of a pattern of a reflective patterning device or mask M, said pattern being arranged in the region of an object plane OS of the projection lens.

In order to facilitate the description, a Cartesian xyz coordinate system is specified, from which the respective positional relationship of the components illustrated in the figures is evident. The projection exposure apparatus WSC is of the scanner type. The mask M and the substrate are moved synchronously in the y-direction during the operation of the projection exposure apparatus, and thereby scanned.

The apparatus is operated with the radiation of a primary radiation source RS. An illumination system ILL serves for receiving the radiation of the primary radiation source and for shaping illumination radiation directed onto the pattern. The projection lens PO serves for imaging the structure of the pattern onto a light-sensitive substrate.

The primary radiation source RS can be, inter alia, a laser plasma source or a gas discharge source or a synchrotron-based radiation source. Such radiation sources generate a radiation RAD in the EUV range, in particular having wavelengths of between 5 nm and 15 nm. In order that the illumination system and the projection lens can operate in said wavelength range, they are constructed with components that are reflective to EUV radiation.

The radiation RAD emerging from the radiation source RS is collected using a collector COL and directed into the illumination system ILL. The illumination system comprises a mixing unit MIX, a telescope optical unit TEL and a field forming mirror FFM. The illumination system shapes the radiation and thus illuminates an illumination field situated in the object plane OS of the projection lens PL or in proximity thereto. In this case, the form and size of the illumination field determine the form and size of the effectively used object field OF in the object plane OS.

A reflective reticle or some other reflective patterning device is arranged in the object plane OS during operation of the apparatus.

The mixing unit MIX substantially consists of two facet mirrors FAC1, FAC2. The first facet mirror FAC1 is arranged in a plane of the illumination system which is optically conjugate with respect to the object plane OS. Therefore, it is also designated as a field facet mirror. The second facet mirror FAC2 is arranged in a pupil plane of the illumination system that is optically conjugate with respect to a pupil plane of the projection lens. Therefore, it is also designated as a pupil facet mirror.

With the aid of the pupil facet mirror FAC2 and the imaging optical assembly which is disposed downstream in the beam path and which comprises the telescope optical unit TEL and the field forming mirror FFM operated with grazing incidence, the individual mirroring facets (individual mirrors) of the first facet mirror FAC1 are imaged into the object field.

The spatial (local) illumination intensity distribution at the field facet mirror FAC1 determines the local illumination intensity distribution in the object field. The spatial (local) illumination intensity distribution at the pupil facet mirror FAC2 determines the illumination angle intensity distribution in the objet field.

The projection lens PO serves for the reducing imaging of the pattern arranged in the object plane OS of the projection lens into the image plane IS that is optically conjugate with respect to the object plane and lies parallel thereto. The imaging is effected with electromagnetic radiation from the extreme ultraviolet range (EUV) around a working wavelength $\lambda$, which in the case of the example is 13.5 nm.

The projection lens comprises six mirrors M1 to M6 having mirror surfaces which are arranged in a projection beam path PR between the object plane OS and the image plane IS in such a way that a pattern arranged in the object plane or in the object field OF is imaged into the image plane or the image field IF via the mirrors M1 to M6. In this case, the rays of the projection beam that run between the object plane and the image plane form a wavefront WF.

The mirrors (EUV mirrors) M1 to M6 having a reflective effect for radiation from the EUV range each comprise a substrate, on which is applied a multilayer arrangement having a reflective effect for radiation from the extreme ultraviolet range and comprising a large number of layer pairs comprising alternately relatively low refractive index and relatively high refractive index layer material and acting in the manner of a distributed Bragg reflector.

The layer pairs (bilayer) comprise alternately applied layers of a layer material having a higher real part of the refractive index (also called "spacer") and of a layer material having a lower real part of the refractive index relative thereto (also called "absorber"). Layer pairs can be constructed e.g. with the layer material combinations of molybdenum/silicon (Mo/Si) and/or ruthenium/silicon (Ru/Si). In this case, silicon respectively forms the spacer material, while Mo and/or Ru respectively serve as absorber material. A layer pair can contain at least one further layer, in particular an interposed barrier layer, which can consist e.g. of C, $B_4C$, $Si_xN_y$, SiC or of a composition comprising one of these materials and is intended to prevent interdiffusion at the interface.

The mirrors M1 to M6 each have curved mirror surfaces, such that each of the mirrors contributes to the imaging. The rays of the projection beam path which come from the object field OF are firstly incident on the slightly convexly curved first mirror M1, which reflects the rays to the slightly concavely curved second mirror M2. The latter reflects the rays to the convex third mirror M3, which deflects the rays laterally to the concave mirror M4. The latter reflects the rays onto the fifth mirror M5, which is arranged geometrically in proximity to the image plane and which has a slightly convexly curved mirror surface and reflects the rays to the large concave mirror M6, which is the last mirror from the image plane and focuses the rays in the direction of the image field IF.

The projection lens consists of two partial lenses. In this case, the first four mirrors M1 to M4 form a first partial lens, which generates an intermediate image IMI in the ray path between the fourth mirror M4 and the fifth mirror M5. The intermediate image lies in an intermediate image plane that is optically conjugate with respect to the object plane and with respect to the image plane. Geometrically, the intermediate image is arranged alongside the sixth mirror M6. The second partial lens, which consists of the fifth and sixth mirrors, images the intermediate image onto the image plane in a reduced fashion.

Projection exposure apparatuses and projection lenses having this or a similar construction are disclosed for example in the U.S. Pat. No. 7,977,651 B2. The disclosure of said patent is incorporated by reference in the content of this description.

The projection lens PO comprises a wavefront correction device WFC, which comprises a film element FE having an optical used region UA, which is arranged in the projection beam path PR in the illustrated operating mode of the wavefront correction device. The multilayer film MF, which is partly transmissive to the EUV radiation, is arranged in the single beam path between the second mirror M2 and the third mirror M3. From an optical standpoint, it is situated between the pupil plane PS1 of the first partial lens and the intermediate image IMI optically relatively close to the pupil surface PS1. The subaperture ratio can be in the range of between 0.8 and 0.95, for example, at the location of the film element.

As illustrated in the detailed rendering of FIG. 1a, multilayer film MF is a largely planar optical element and is situated in the projection beam path such that radiation passes through it substantially perpendicularly, i.e. substantially parallel to the surface normal N of the multilayer film MF. The angles of incidence measured between the ray direction and the surface normal N are in the range of less than 10°. A polarization-selective effect is thereby avoided, such that the transmission of the multilayer film MF is substantially independent of the polarization state or of the oscillation direction of the electric field vector of the rays passing through.

The film element FE has a mechanically stable frame R, which is configured in a substantially ring-shaped manner and which supports the multilayer film MF such that the multilayer film is self-supporting in the optical used region UA. All frame elements are therefore situated outside the optical used region. The self-supporting film can be tensioned or sagging. It can have a slightly wrinkled form, if appropriate.

In other embodiments, a lattice-like supporting structure is provided for stabilizing the multilayer film in the optical used region, said supporting structure being in contact with the multilayer film in the optical used region and stabilizing said multilayer film. The lattice-like supporting structure can have, for example, a honeycomb structure having struts that form hexagonal openings. Film elements comprising such supporting structures are known from U.S. Pat. No. 7,639,418 B2, for example, and are used therein as "spectral purity filter" in the region of the EUV light source of a projection exposure apparatus.

Figure 2:
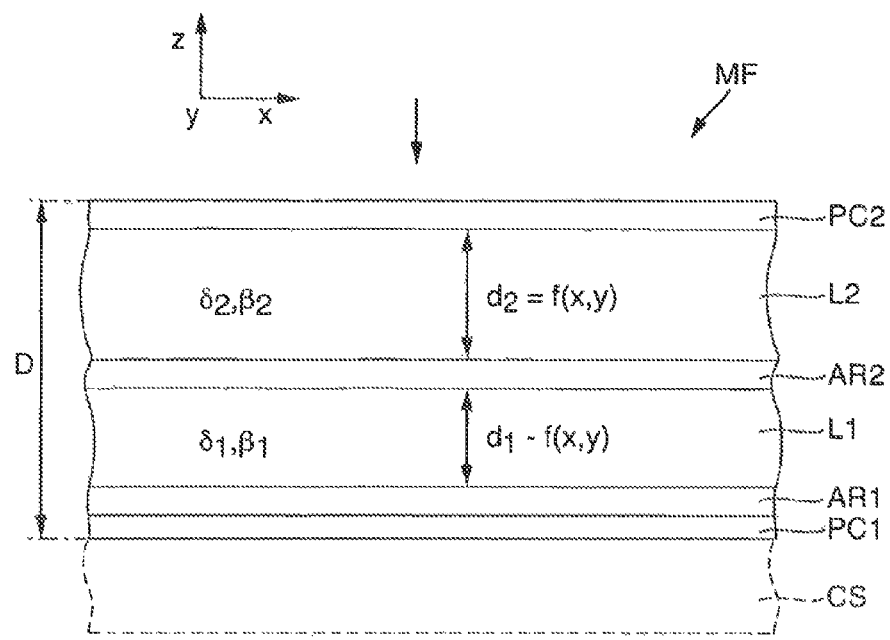
FIG. 2 shows a schematic section through one embodiment of a multilayer film for wavefront correction.

FIG. 2 shows a schematic section through one embodiment of a multilayer film MF, which can be used in the film element FE in FIG. 1 or elsewhere. The multilayer film comprises six layers having different functions, which in some embodiments can be mechanically stabilized by an optional support structure CS at a side of the layer stack. In the installation state, radiation passes through the multilayer film substantially perpendicularly to the film plane (x-y plane). From the radiation exit side (at the bottom in the figure), the layer stack begins with a first outer protective layer PC1, to which a first antireflection layer AR1 is applied. This is followed by the first layer L1, which has a relatively small real part of the refractive index or a relatively large deviation $\delta_1$ of the real part of the refractive index from the value 1 and also a relatively low first absorption coefficient $\beta_1$. A second antireflection layer AR2 is applied to the first layer. Said second antireflection layer bears a second layer L2 composed of a second layer material, which, in comparison with the first layer material, has only a relatively small deviation $\delta_2$ of the real part of the refractive index from 1, but in return has a relatively high absorption coefficient $\delta_2$. The layer stack terminates with a second outer protective layer PC2 at the radiation entrance side.

In contrast to what is shown in the schematic illustration, the layer thickness $d_1$ of the first layer varies within the optical used region in a lateral direction, such that $d_1=f(x,y)$ holds true. The same correspondingly applies to the second layer L2. The first layer thickness $d_1$ thus varies in the x-direction and y-direction. The second layer L2 also has a locally varying layer thickness $d_2$, which can change locally both in the x-direction and in the y-direction. The extent of the layer thickness variations is distinctly above the extent of manufacturing-dictated layer thickness variations.

The outer protective layers PC1, PC2 can consist of ruthenium, rhodium or silicon nitride, for example, wherein silicon nitride may be advantageous owing to its low absorption at the working wavelength (13.5 nm). The first protective layer PC1 and/or the second protective layer PC2 can be omitted, if appropriate. It may sometimes suffice to have an outer protective layer by oxidation of the surface layer.

The antireflection layers AR1, AR2 here each have a geometrical layer thickness of approximately 6 nm, which corresponds to an optical layer thickness of approximately $\lambda/2$ in the case of the layer materials used (e.g. Mo/Si or Ru/Si), thus resulting in a reflection-reducing and hence in this respect transmission-increasing effect. The first antireflection layer AR1 and/or the second antireflection layer AR2 can also be omitted.

Primarily the first layer L1 and the second layer L2 are crucial for the optical effect of the film. The primary function of the first layer L1 consists in introducing in the rays passing through, in a location-dependent manner, a phase delay $\Delta\rho$ dependent on the local optical layer thickness of the first layer, thus resulting in locally different phase delays and hence a wavefront correction on a wavefront passing through. However, on account of the non-vanishing absorption, the first layer material also introduces a location-dependent attenuation of the radiation intensity passing through, the extent of the attenuation being greater in relatively thicker regions than in relatively thinner regions. This results in a generally unwanted location-dependent intensity attenuation effect. The primary function of the second layer L2 is to counteract the transmission attenuation introduced by the first layer in a manner such that an intensity profile required for the projection lens is established overall over the optical used region, for example a uniform attenuation over the entire used region or an attenuation having a substantially rotationally symmetrical characteristic with a rise or fall of the apodization from the center to the edge of the pupil plane. At the same time, the second layer material, on account of the relatively small deviation $\delta_2$ of the real part of the refractive index from the value 1, is intended to have only a small effect on the wavefront, which, if appropriate, can already be taken into account in the design of the layer thickness profile of the first layer.

Figure 3A:
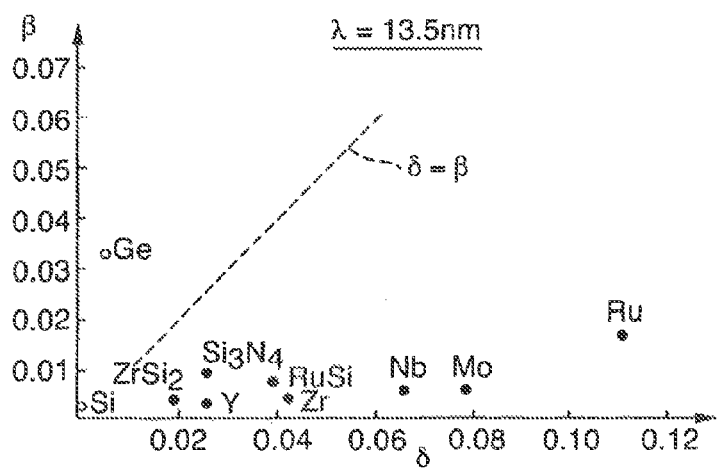
FIG. 3A illustrates layer materials for $\lambda$=13.5 nm

FIG. 3A illustrates some layer materials suitable for the construction of wavefront correction films for the working wavelength $\lambda$=13.5 nm. The diagram shows the deviation $\delta$ of the real part of the complex refractive index from the value 1 on the x-axis and the absorption coefficient $\beta$ on the y-axis. The materials to the left of the straight line $\delta=\beta$ are particularly suitable as second layer material, while the materials to the right of said straight line, in conjunction with a comparatively low real part of the refractive index, have lower absorption and are therefore particularly suitable for the wavefront correction layer (first layer). The values in the diagram are derived from a corresponding diagram in the dissertation "Surface and Interface Dynamics in Multilayered Systems" by T. Tsarfati (2009) ISBN 978-90-5335-197-0, Chapter 1, page 12.

Table A below shows the corresponding values of the effectiveness ratio $V=\delta/\beta$ for various layer materials that can be used particularly at a working wavelength of 13.5 nm.

TABLE A

| | |
|---|---|
| Mo | 11.84 |
| Y | 11.51 |
| Ru | 6.66 |
| Nb | 12.75 |
| Zr | 10.92 |
| RuSi | 5.82 |
| $Si_3N_4$ | 2.88 |
| $ZrSi_2$ | 6.19 |
| Si | 0.55 |
| Ge | 0.17 |

Figure 3B:
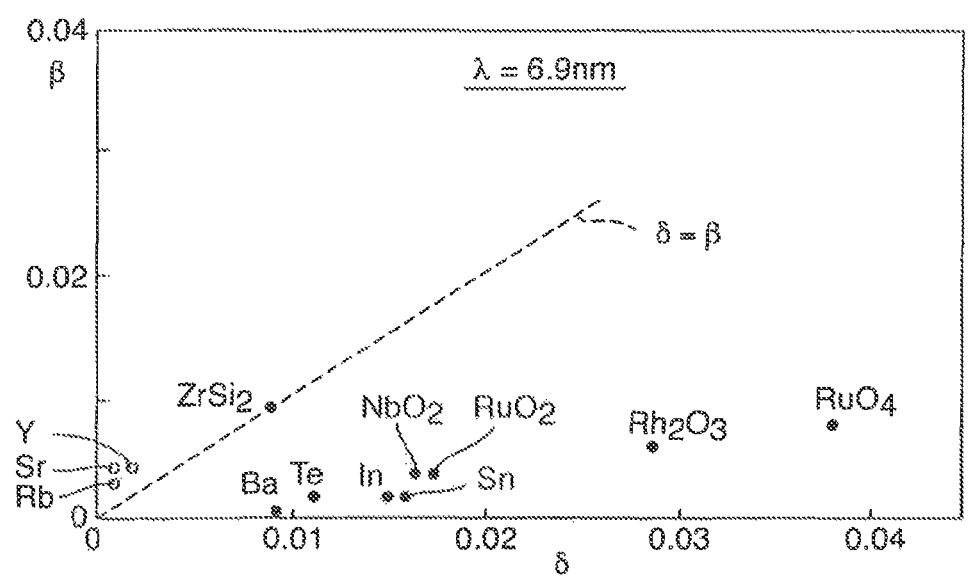
FIG. 3B illustrates layer materials for $\lambda$=6.9 nm.

FIG. 3B shows a corresponding diagram for the working wavelength λ=6.9 nm. It can be discerned that, by way of example, rubidium (Rb), strontium (Sr) or yttrium (Y) are suitable as material for the second layer, while for the first layer it is possible to use, for example, $NbOB_4C$, $NbO_2$, $Nb_2O_5$, $RuO_4$, $MoO_2$, $Rh_2O_3$, C, Te, In, Ba, Sn, $RuO_2$, $MoO_3$, La, B, $B_4C$, BN (boron nitride), $ZrO_2$ or a material composition that predominantly consists of one of these materials. The values are theoretical values, obtainable e.g. via: http://henke.lbl.gov/optical_constants/getdb2.html.

The interplay of the optical effects of the first and second layers is explained below on the basis of a concrete example in association with FIGS. 4 to 6.

Figure 4A:
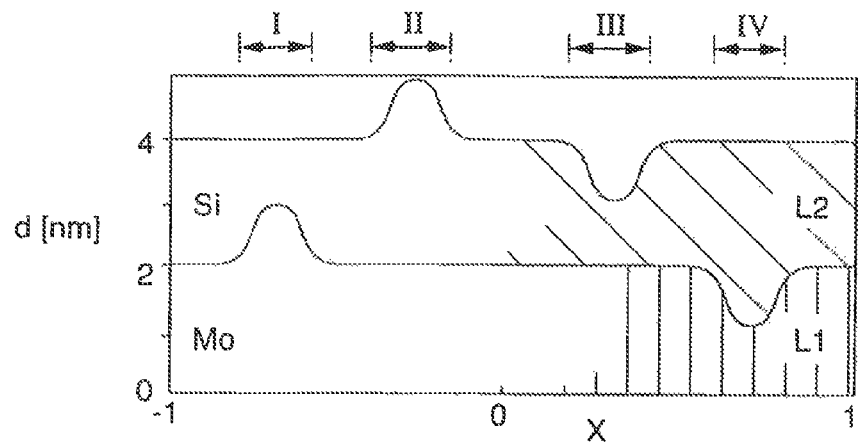
FIGS. 4A-4C, 5A-5C, and 6A-6C show the interplay of the optical effects of a first layer composed of Mo and a second layer composed of Si on the basis of a concrete example for layer thickness profiles.

FIG. 4A shows an excerpt from a first layer L1 composed of molybdenum (Mo) and a second layer L2 composed of silicon (Si) applied thereto, wherein the layer thicknesses of both layers vary locally in the x-direction (normalized x-axis). Both layers are shown in each case in a partly hatched fashion and have an average thickness of 2 nm and regions having positive and negative deviations therefrom. In the molybdenum layer, an increase in the layer thickness by a maximum of 1 nm is present in the region I between x=−0.8 and x=−0.6 and a layer thickness reduction by 1 nm to a minimum of 1 nm is present in the region IV between x=0.6 and x=0.8. In the silicon layer, a local layer thickness increase by a maximum of 1 nm is present in the region II between x=−0.4 and x=−0.2 and a local layer thickness minimum having a layer thickness of only 1 nm is present in the region III between x=0.2 and x=0.4.

Both layers have both a phase-delaying effect and an intensity-attenuating effect on the EUV radiation passing through in the z-direction. However, these effects are different depending on the local layer thicknesses and the optical constants δ and β of the respective layers. The following approximately hold true: $δ_1=δ(Mo)=0.076$, $ß_1=13(Mo)=0.006$, $δ_2=δ(Si)=0.001$ and $ß_2=β(Si)=0.002$.

Figure 5A:
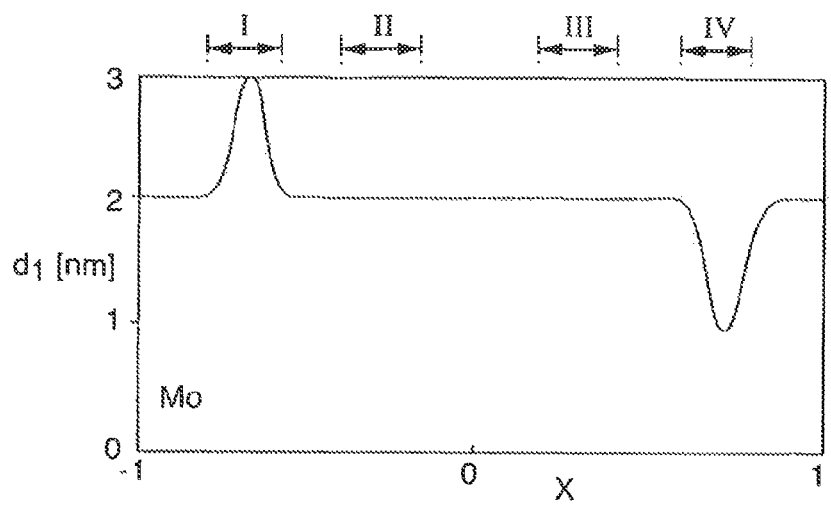
Figure 5B:
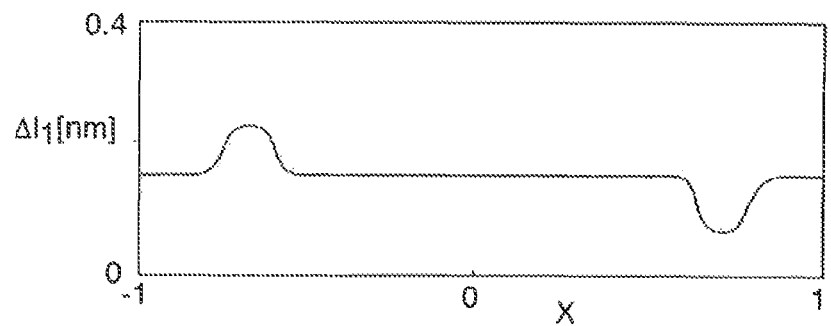
Figure 5C:
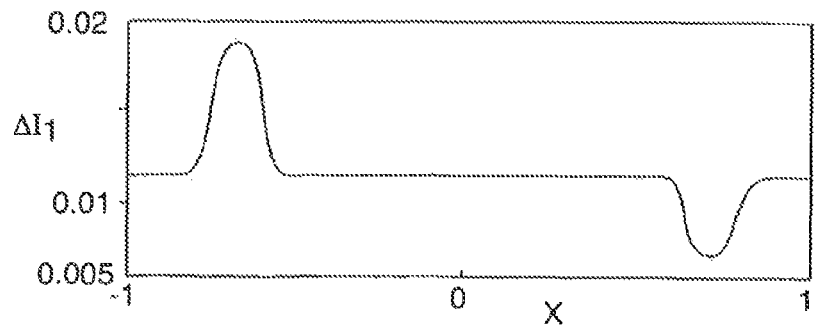

Firstly, with reference to FIG. 5, only the molybdenum layer (first layer) will be considered, the layer thickness profile of which is illustrated again in FIG. 5A. FIG. 5B shows the wavefront effect $Δρ_1$ of the first layer (molybdenum layer) in nanometers, and FIG. 5C shows the transmission-reducing effect of the first layer, that is to say the relative transmission loss. For calculating the wavefront effect, the real part (1−δ) of the refractive index or the deviation $δ_1$ is crucial, wherein the value $δ_1=0.08$ means that the phase velocity of the wavefront passing through is reduced from the value 1 to the value 0.92. The phase delay brought about overall as a result is linearly dependent on the local layer thickness $d_1$. In the region I, the local layer thickness (3 nm) is 1 nm above the average layer thickness, such that here 1 nm more of the first layer material has a phase-delaying effect. A corresponding phase delay relative to the average phase delay can be discerned in FIG. 5B. The conditions are reversed in the region IV, since here only 1 nm of molybdenum has an effect in the region of the layer thickness minimum. Accordingly, a smaller phase delay results in comparison with the average phase delay (caused by 2 nm of Mo).

The extent of the intensity attenuation ΔI is also dependent on the layer thickness d. The following generally holds true:

$$ΔI=1-e^{-((4π/λ)·dβ)}$$

In this case, the layer thickness d is in the exponent of the exponential function. In the region I, a particularly high relative transmission loss arises on account of the local thickness maximum, while the smallest relative transmission loss occurs in the region IV on account of the local layer thickness minimum of the first layer thickness.

Figure 6A:
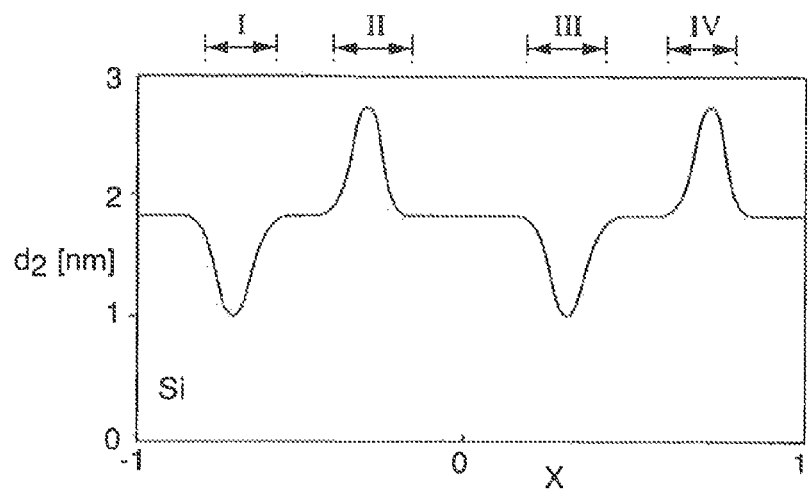

The layer thickness profile of the second layer (silicon layer) is illustrated in FIG. 6A. The layer thickness here has a somewhat more complex profile since it is particularly small (a minimum of only 1 nm) for example in the region I on account of the local layer thickness maximum of the molybdenum layer and in the region III on account of the local minimum in the Si layer, while it assumes a local maximum in each case in the regions II and IV.

Figure 6B:
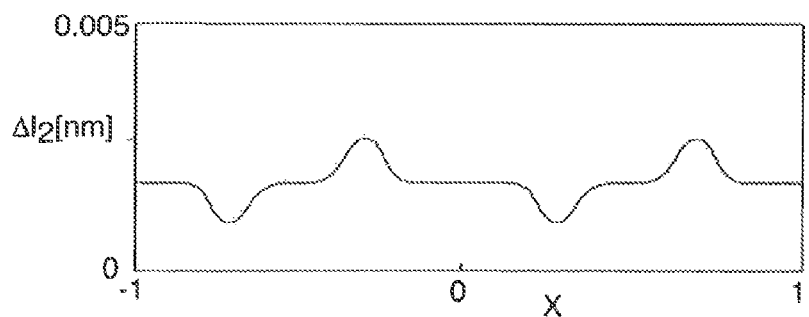
Figure 6C:
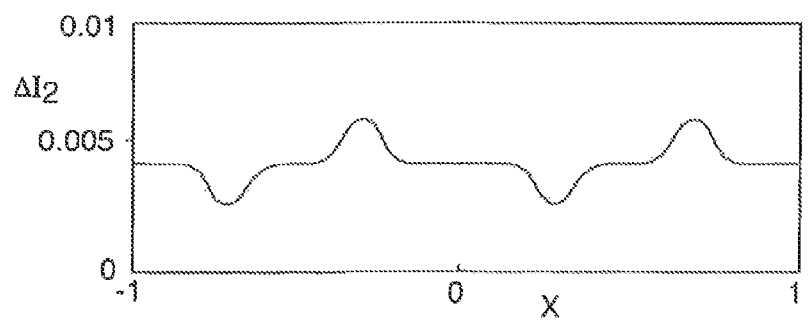

FIG. 6B shows the corresponding wavefront effect $Δρ_2$ of the second layer (Si layer) in nanometers, while FIG. 6C shows the relative transmission loss $ΔI_2$ of the second layer as a function of the location on the x-axis.

Figure 4B:
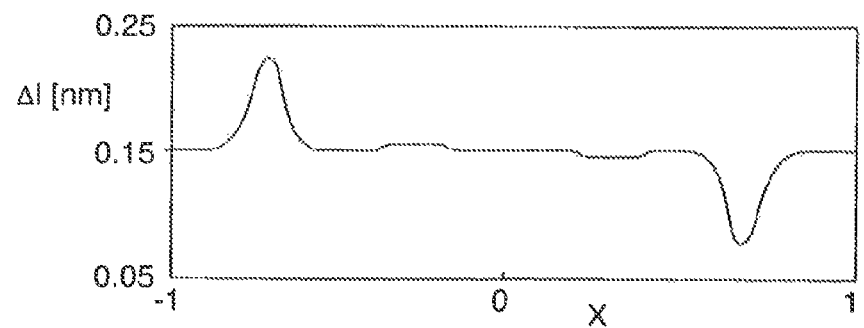
Figure 4C:
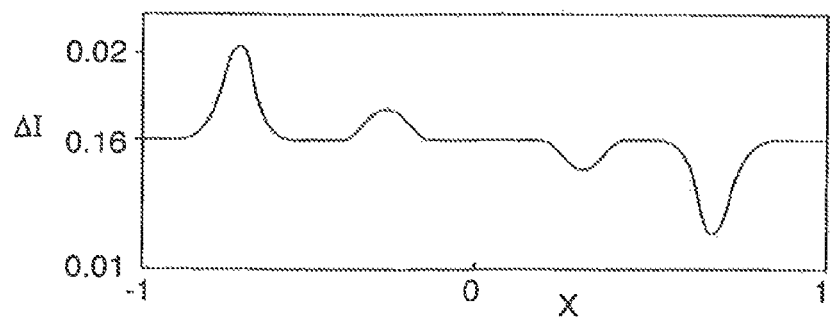

The effects of both layers add up positionally correctly when a wavefront passes through. The wavefront effect of the multilayer film comprising a first layer composed of Mo and a second layer composed of Si is illustrated in FIG. 4B. FIG. 4C correspondingly shows the location dependence of the relative transmission loss of the multilayer film.

FIG. 4B shows the effect on the wavefront of both layers with identical scaling on the axis of the phase delay Δρ. It can be discerned that molybdenum, exhibiting a significantly greater phase delay, dominates the profile of the wavefront effect in the first region I and in the fourth region IV. In comparison therewith, the phase delay effect in the regions II and III, where a particularly large (region II) and a particularly small (region III) absolute layer thickness of the silicon layer are present, is only very small.

In the case of the total effect on the transmission (FIG. 4C) it can be discerned that the absolute extent of the intensity attenuation caused by the molybdenum layer is made more uniform by the silicon layer. The difference between maximum and minimum local intensity loss is smaller than in the case of the pure Mo layer on account of the compensating effect of the Si layer.

Figure 7:
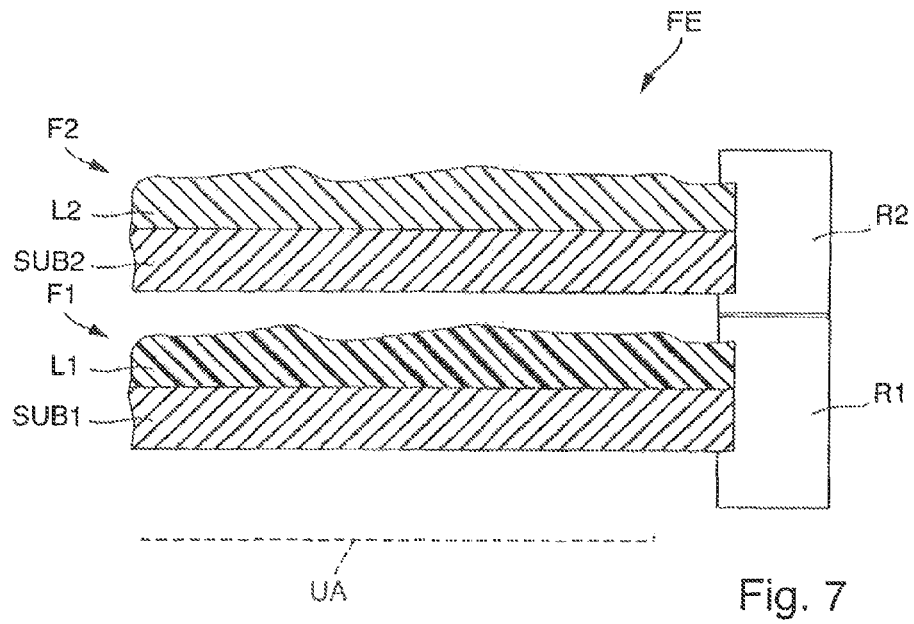
FIG. 7 shows a schematic section through an embodiment in which the first layer and the second layer are arranged in spatially separated films situated optically in proximity to one another.

It is not necessary for the first layer and the second layer to be present at the same film. FIG. 7 shows by way of example a schematic section through one embodiment of a film element FE, in which the first layer and the second layer are arranged in spatially separated films situated optically in proximity to one another. A first film F1 has a thin film substrate or a thin film supporting layer SUB1, on which a first layer L1 (e.g. composed of molybdenum) having a locally varying layer thickness is applied. The first film is held by a mechanically stable first frame R1, the frame parts of which all lie outside the optical used region UA. The first frame R1 is connected fixedly, but in a releasable manner, to an identical second frame R2 using screws or in some other way. The second frame supports a second film F2. The second film F2 has a thin film substrate (film supporting layer) SUB2, on which a second layer L2 (e.g. composed of silicon) having a locally varying layer thickness is applied. The geometrical distance between the films perpendicular to the film planes is a few millimeters, e.g. between 1 mm and 10 mm. As a result, in the installed state, they are arranged practically at the same location (substantially identical subaperture ratio) of the projection beam passing through. The layer thickness profiles of the two layers L1, L2 are complementary. The mechanical stability of the two films is substantially determined by the stability of the film substrates or film supporting layers. The latter can consist e.g. of silicon or of a polymeric material.

The film substrates or film supporting layers of uniform thickness are designed for optimum transmission in conjunction with sufficient stability and have e.g. thicknesses in the range of 10 to 100 nm, preferably 20 nm to 50 nm. The material of the film layer L1 of the film F1 and L2 of the film F2, respectively, can be identical to the material of the film supporting layers SUB1 and SUB2, respectively, and even during the protection process with identical material it is not possible to distinguish between producing the film layer (L1 or L2) and the associated film supporting layer (SUB1 or SUB2).

A cleaning apparatus (not illustrated) can be mounted between the two films F1 and F2 and the frames R1 and R2, said cleaning apparatus purging the interspace between the films F1 and F2 with purging gas, for example hydrogen, at certain time intervals.

In this embodiment, both layers (the first layer and the second layer) are freely accessible for subsequent processing (e.g. with an ion beam), as a result of which the optimization of the layer thickness profiles is simplified.

Figure 8:
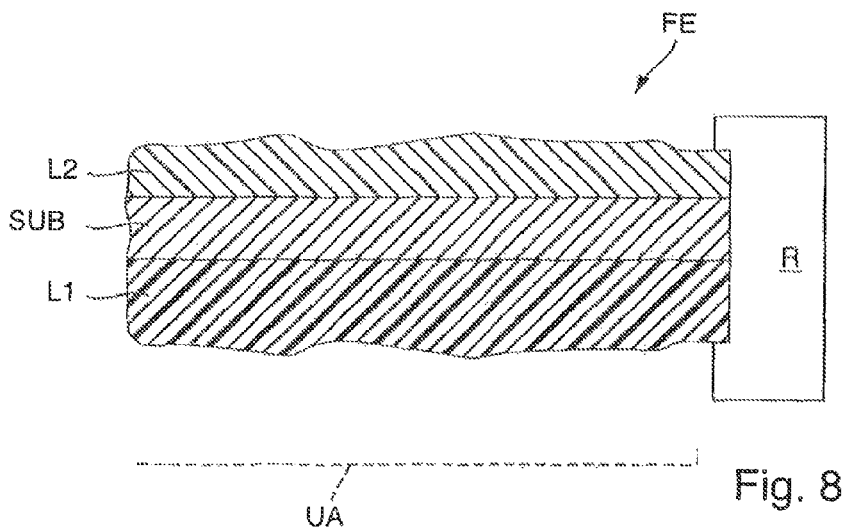
FIG. 8 shows a schematic section through an embodiment of a multilayer film in which the first layer and the second layer are arranged on opposite sides of a stable film substrate.

FIG. 8 shows by way of example a schematic section through one embodiment of a film element FE comprising a multilayer film MF, in which the first layer and the second layer are arranged on opposite sides of a film supporting layer SUB. As a result, both layers, independently of one another, are freely accessible for processing and subsequent layer thickness profile change. The film supporting layer SUB can, for example, consist of Mo or Si or be of a multilayer composed of Mo and Si. Here, too, the material of the first and second layers L1 and L2, respectively, can be identical to that of the film supporting layer SUB and during the production process there is no need to distinguish between applying the layers L1 and L2 and the film supporting layer SUB.

FIG. 7 and FIG. 8 do not illustrate the possible option of dispensing with the film supporting layers SUB and SUB1 and SUB2 on account of sufficient stability of the first and second layers L1 and L2, respectively.

In the case of the embodiments in FIGS. 7 and 8, in principle the same conditions as presented in detail above are applicable to the selection of the layer materials. Therefore, reference is made to the description there.

FIG. 9 shows an example of another projection lens PO which is equipped or can be equipped with a film-based wavefront correction device. Elements identical or corresponding to those in FIG. 1 bear the same designations. The construction of the projection lens including the optical data is described in US 2008/0170310 A1 corresponding to EP 1 950 594 A1 (FIG. 2). The content of said documents is in this respect incorporated by reference in the content of this description.

The illustration shows the beam path of in each case three individual rays that proceed from five spaced-apart object field points.

Proceeding from the object plane OS, the individual rays are reflected firstly by a first mirror M1 and then successively by the second to sixth mirrors M2 to M6, which are in each case covered with highly reflective multilayer coatings.

The mirrors, M1, M3 and M5 have a convex basic form, that is to say can be described by a convex best-matched surface. The mirrors M2, M4 and M6 have a concave basic form, that is to say can be described by a concave best-matched surface. In the following description, such mirrors are designated merely as convex or concave for simplification. The convex third mirror M3 provides for a good Petzval correction.

The individual rays associated with a specific illumination direction of the five object field points are combined in a pupil plane PS1 of the projection lens PO, adjacent to which the third mirror M3 is arranged. The third mirror M3 is therefore also designated as a pupil mirror. An aperture stop for delimiting the projection beam can be arranged in the pupil plane PS1. Said aperture stop can be provided by a mechanical and exchangeable stop or else in the form of a corresponding coating directly on the mirror M3.

The mirrors M1 to M4 image the object plane OS into an intermediate image plane IIS. The intermediate-image-side numerical aperture of the projection lens is 0.2. The mirrors M1 to M4 form a first partial imaging optical unit having a reducing imaging scale of 3.2×. The downstream mirrors M5 and M6 form a further partial imaging optical unit of the projection lens having a reducing imaging scale of 2.5×. In the region of the intermediate image plane IIS, a through-opening OP6 is formed in the sixth mirror M6, the projection beam passing through said opening upon reflection from the fourth mirror M4 toward the fifth mirror M5. The fifth mirror M5 in turn has a central through-opening OP5, through which the projection beam passes between the sixth mirror M6 and the image plane IS.

The fifth mirror M5 is arranged in proximity to a further pupil plane PS2, which is conjugate with respect to the first pupil plane PS1. Typically, the further pupil plane PS2 is situated in the projection beam path between the fifth mirror M5 and the sixth mirror M6, such that a physically accessible stop plane exists at the location of the further pupil plane PS2.

The projection lens has an obscuration stop arranged in a centered manner in one of the pupil planes PS1, PS2. This obscures the partial rays of the projection beam path that are assigned to the central through-openings OP5, OP6. Therefore, the design of the projection lens is also designated as a design with central pupil obscuration.

A distinguished individual ray that links a central object field point to a centrally illuminated point in the entrance pupil of the projection lens in the entrance pupil plane PS1 is also designated hereinafter as chief ray CR of a central field point. Following reflection at the sixth mirror M6, the chief ray CR of the central field point forms approximately a right angle with the image plane IS, that is to say runs approximately parallel to the z-axis of the projection exposure apparatus. The image field is rectangular.

All six mirrors M1 to M6 of the projection lens PO are embodied as freeform surfaces that cannot be described by a rotationally symmetrical function.

The projection lens PO affords a plurality of positions for inserting a film element of a wavefront correction device.

In one embodiment, illustrated in plan view in FIG. 9A, a first film element FE1 in the form of a multilayer film is arranged at a first position POS1 optically in proximity to the first pupil plane PS1 in the beam path between the second and third mirrors. Wavefront aberrations can thus be corrected uniformly over the entire field. The subaperture ratio SV is in this case approximately 0.7 to 0.95.

Another embodiment, illustrated in plan view in FIG. 9B, seeks to correct a field profile of a wavefront aberration using a film element. For this purpose, a correspondingly adapted film element, e.g. a second film element FE2 in the form of a multilayer film, is inserted at a second position POS2 in optical proximity to the object plane OS between the object plane and the first mirror M1. The subaperture ratio SV is in this case approximately 0.05 to 0.3.

By way of example, the film element can be designed such that a linear or nonlinear profile of image aberrations perpendicular to the scanning direction (y-direction), i.e. along the long axis of the image field, can be corrected or reduced in its extent.

It is also possible for a film element to be arranged both at a position in proximity to the pupil and at a position in proximity to the field. This variant is shown in FIG. 9.

In order to illustrate the positions in the projection beam path, FIG. 9 illustrates the first film element FE1 the second film element also in plan view parallel to the z-direction. The circular frame R can be discerned in each case, said frame supporting the partly transparent, self-supporting multilayer film MF. The area of intersection of the projection beam with the film surface is the so-called "footprint" FP1 and FP2, respectively. This region is illuminated by the projection beam, wherein all beams proceeding from the (infinite number of) field points of the rectangular object field OF contribute to the illumination of the footprint. It can be discerned that in proximity to the object plane OS the footprint FP1 has approximately the (in the real system slotted) rectangular shape of the object field, the corner regions being rounded. In proximity to the pupil plane PS1, the footprint FP2 is virtually circular. A minimal circle enclosing the footprint shall have the diameter $D_{CA}$. This diameter is designated here as the optically free diameter.

Each object field point is the origin of a beam (cone of radiation) whose aperture angle is determined by the object-side numerical aperture. Each beam is associated with a subaperture SA corresponding to that region which is illuminated on an optical surface (here: film surface) by a beam proceeding from a single object field point. A subaperture on a given surface can be characterized by its subaperture diameter $D_{SA}$. In proximity to the object plane (or a different field plane), said subaperture or its diameter is relatively small. In the region of a pupil plane, ideally all subapertures of the different field points should overlap, each beam illuminating the entire used pupil.

It is qualitatively discernible that the subaperture ratio $SV=D_{SA}/D_{CA}$ of the first film element FE1 in proximity to the field is relatively small (e.g. between approximately 0.05 and 0.3), while SV at the second film element FE2 arranged in optical proximity to the pupil plane PS1 is close to the value 1, e.g. between 0.7 and 0.95.

The way in which a film element can be designed in practice is explained by way of example below. The presentation applies to all embodiments.

The task of the film element is to set wavefront variation and/or transmission variation of the projection lens according to the target stipulations.

The starting point for this is wavefronts and/or transmissions at one or a plurality of field points. These can be obtained by measurements and/or simulations. An extrapolation and/or interpolation to a plurality of field points is additionally possible. These data obtained in this way are the starting point for the optimization step described below, and are designated as wavefront data and/or transmission data, respectively.

In a first step, it is assumed here that the wavefront can be corrected by a "perfect wavefront correction layer" of the film element. A "perfect wavefront correction layer" is understood to be a theoretical layer whose complex refractive index n at the working wavelength λ is n=0+0i, such that 1 nm wavefront correction layer reduction (layer thickness difference) is thus translated into 1 nm wavefront phase. The concept of a light ray modeled as moving infinitely fast is borrowed from the Sweatt model. As an illustrative alternative it is also possible to use a theoretical layer whose complex refractive index n at the working wavelength λ is n=0.9+0i, such that 1 nm wavefront correction layer reduction (layer thickness difference) is translated into 0.1 nm wavefront phase. In this case, after the calculation of the wavefront correction layer thickness, the latter has to be multiplied by the factor 0.1 in order to obtain the "perfect wavefront correction layer".

For given wavefront data, for the film element position defined in the beam path of the projection lens, a perfect wavefront correction layer is now calculated by virtue of a suitably formulated optimization problem. For this purpose, firstly so-called basis deformations are calculated. These basis deformations can have for example the form of Zernike polynomials having a certain maximum amplitude (for example 1 nm) which are defined on a circular region that fully encompasses the optically used region (the optical used region) of the film of the film element positioned in the beam path. Besides Zernike polynomials it is also possible to use splines or B-splines or else nurbs, the computational field of which likewise fully encompasses the optically used region of the film of the film element. For these basis deformations thus obtained (for example 36 or 64 or 100 Zernikes and/or 25 or 49 or 100 splines or B-splines or nurbs), the optical sensitivity thereof is calculated with the aid of an optical design program. That is to say that the wavefront effect of the basis deformations in a perfect wavefront correction layer is calculated.

The basis deformations are then interpreted as manipulator degrees of freedom. The optimization problem then consists in approximating the wanted (field point by field point) wavefront effect as well as possible with said degrees of freedom. This can be done for example by solving the minimization problem $$\min \|Mx-p\|_2^2 + \|Gx\|_2^2$$

In this case, M denotes an n×m matrix having the m basis deformations developed into n elementary image aberrations. These elementary image aberrations can be for example pixel by pixel wavefront values at different field points, selected Zernike coefficients of these wavefronts at different field points or superpositions thereof. The vector p describes the wavefront data in the predefined manner, x denotes the manipulated vector to be found, which describes the amplitudes of the basis deformations to be superposed, and G is a suitable weight matrix, for example the unit matrix provided with a scalar multiple. The method presented here is the so-called Tikhonov regularization, which is described in greater detail for example in A. Rieder, Keine Probleme mit inversen Problemen [No problems with inverse problems], Vieweg, 2003 on page 70 (example 3.3.11) and in chapter 4. That also explains how the minimization problem can be transformed into a system of equations in order to solve this by one of the known methods, such as, for example, the Gaussian elimination method. Alternatively, it is also possible to consult the internet page http://en.wikipedia.org/wiki/Tikhonov_regularization (viewed on 8 Feb. 2012)

A further possible method is described in WO 2010/034674 A1 in connection with a different problem.

The use of such a method results in a stipulation of the profile of a "perfect wavefront correction layer" of the film element, characterized by the function w:=w(x,y) for describing the location-dependent layer thickness. The function w can have both positive and negative layer thickness values. The way in which the negative layer thickness values can be eliminated is described further below.

It should be mentioned that the procedure described above is only one exemplary procedure for calculating a perfect wavefront correction layer.

If only the transmission behavior of the projection lens is intended to be corrected, then the wavefront correction layer can be described by the function w=w(x,y)=0.

In a second step, it is firstly assumed that the transmission profile can be corrected by a "perfect transmission correction layer" of the film element.

A material having a complex refractive index n=(1−δ)+iβ at the working wavelength λ shall initially be presented. If a light ray covers a path length d in this material, then the transmission t is $$t=\exp(-(4\pi/\lambda)d\beta).$$

What is disadvantageous here is that the transmission no longer varies linearly with the thickness of the material, but rather exponentially. This has the effect that firstly the approach of reducing the problem to a linear equation system fails.

By contrast, if the logarithmic transmission ln t is considered, given by $$\ln t=-(4\pi/\lambda)d\beta,$$

then it is evident that the logarithmic transmission varies linearly with the thickness of the material.

A "perfect logarithmic transmission correction layer" is understood to be a theoretical layer whose complex refractive index n=0+1i.

For given transmission data T(x,y), the logarithmic transmission data ln T(x,y) are calculated. This is always possible since the transmission T(x,y) at every point (x,y) is greater than 0. For the film element position defined in the beam path of the projection lens, a perfect logarithmic transmission correction layer is calculated by virtue of a suitably formulated optimization problem.

An optimization problem is then solved. For this purpose, firstly so-called basis deformations are once again calculated. These basis deformations can have for example the form of Zernike polynomials having a certain maximum amplitude (for example 1 nm) which are defined on a circular region that fully encompasses the optically used region of the film of the film element positioned in the beam path. Besides Zernike polynomials it is also possible to use splines or B-splines or else nurbs, the computational field of which likewise fully encompasses the optically used region of the film of the film element. For these basis deformations thus obtained (for example 36 or 64 or 100 Zernikes and/or 25 or 49 or 100 splines or B-splines or nurbs), the optical sensitivity thereof is calculated with the aid of an optical design program. That is to say that the transmission effect of the basis deformations in a perfect transmission correction layer is calculated and the logarithmic transmission effect is then determined.

The basis deformations are then interpreted as manipulator degrees of freedom. The optimization problem then consists in approximating the wanted (field point by field point) wavefront effect as well as possible with said degrees of freedom. This can be done for example by solving the minimization problem $$\min\|Ny-q\|_2^2+\|Hy\|_2^2$$

In this case, N denotes a k×l matrix having the l basis deformations developed into k elementary image aberrations. These elementary image aberrations can be for example pixel by pixel transmission front values at different field points, selected Zernike coefficients of these transmission fronts at different field points or superpositions thereof. The vector q describes the logarithmic transmission data in the predefined manner, y denotes the manipulated vector to be found, which describes the amplitudes of the basis deformations to be superposed, and H is a suitable weight matrix, for example the unit matrix provided with a scalar multiple. The resulting minimization problem is solved as in the case of the wavefront data.

The use of such a method results in a stipulation of the profile of a perfect logarithmic transmission correction layer of the film element, characterized by the function s:=s(x,y) for describing the location-dependent logarithmic layer thickness.

It should be mentioned that the procedure described above is only one exemplary procedure for calculating a perfect logarithmic transmission correction layer.

If only the wavefront behavior of the projection lens is intended to be corrected, then the logarithmic transmission correction layer can be described by the function s=s(x,y)=0.

All information is now present for making the transition to real materials. Thus, let there be a material $M_1$ for the first layer having a complex refractive index $$n_1=(1-\delta_1)+i\beta_1$$

and a material $M_2$ for the second layer having a complex refractive index $$n_2=(1-\delta_2)+i\beta_2.$$

By way of example, molybdenum (Mo) can be used as material of the first layer and silicon (Si) can be used as material of the second layer. The material thicknesses $m_1=m_1(x,y)$ and $m_2=m_2(x, y)$ of the first and second materials, i.e. the first and second layer thicknesses, are thus intended to be determined such that the equation system $$\delta_1 m_1(x,y)+\delta_2 m_2(x,y)=w(x,y)$$

$$\exp(-4\pi/\lambda(\beta_1 m_1(x,y)+\beta_2 m_2(x,y)))=\exp(s(x,y))$$

is fulfilled at every point (x,y). Suitable discretization of the points (x,y), for example on a lattice of dimension 101×101 or 201×201 or else 501×501, yields the equation system to be solved and thus information about the material thicknesses $m_1$ and $m_2$ to be estimated on a sufficiently fine grid. By logarithmizing the second equation, this equation system can even be reduced to a linear equation system:

$$\delta_1 m_1(x,y)+\delta_2 m_2(x,y)=w(x,y)$$

$$-4\pi/\lambda(\beta_1 m_1(x,y)+\beta_2 m_2(x,y))=s(x,y).$$

This equation system can be solved by the customary methods such as, for example, the Gaussian elimination method for every point (x,y) of the discretization grid and the local material thicknesses $m_1=m_1(x,y)$ and $m_2=m_2(x,y)$ are obtained.

In this case, the functions $m_1=m_1(x,y)$ and $m_2=m_2(x,y)$ can have both positive and negative function values and it is necessary to generate thickness stipulations that can be realized from these theoretical material thicknesses. Firstly, material minimum thicknesses $d_1(x,y)$ and $d_2(x,y)$ of the materials $M_1$ and $M_2$ are defined, which must be exceeded by a film element realized. The material minimum thicknesses can vary locally or else be constant.

In the case where Mo is used as material for the first layer, for example a location-independent minimum thickness of 5 nm or 10 nm or 20 nm can be chosen. In the case where Si is used as material for the second layer, for example a location-independent minimum thickness of 10 nm or 20 nm or 50 nm can be chosen.

the Material Thickness Stipulations $$\tilde{m}_1(x,y)=m_1(x,y)+d_1(x,y)-\min_{(x,y)} m_1(x,y)$$

and $$\tilde{m}_2(x,y)=m_2(x,y)+d_2(x,y)-\min_{(x,y)} m_2(x,y)$$

are then calculated.

It is evident that the wavefront correction, which is only a matter of changing the phase effect, is realized in its full scope. However, the transmission correction is only realized up to a constant factor of less than 1, since any layer thickness at the working wavelengths considered leads to an appreciable transmission loss and the transmission of the system can only be decreased by adding material thicknesses.

FIG. 10 shows, on the basis of a numerical example, significant results obtained when using the procedure described above: FIG. 10A illustrates the profile $d_1'$ [nm] of a "perfect wavefront correction layer" which is intended to be realized on a film element comprising a multilayer. The PV value of the difference between highest elevation and deepest valley of the "perfect wavefront correction layer" $w(x,y)$ is approximately 1.4 nm. A wavefront profile with a maximum phase difference of approximately 1.4 nm is therefore corrected. It is additionally assumed that the film element is only intended to correct the transmission variation induced by the wavefront correction layer. The "perfect logarithmic transmission correction layer" $s(x,y)$ can therefore be assumed to be equal to 0 as a constant.

Molybdenum (Mo) is chosen as material of the wavefront correction layer and silicon (Si) is chosen as material for the transmission correction layer. Both materials contribute to the wavefront correction. FIG. 10B shows the computational layer thickness profile $d_1'$ [nm] of the wavefront correction layer obtained by solving the equation system. In this case, it is noticeable that both positive and negative layer thickness values occur.

The computational layer thickness values from FIG. 10B have been converted into implementable layer thickness values $d_1$ [nm] in FIG. 10C. For this purpose, a layer having a constant layer thickness has been added to the computational layer thickness profile, such that the smallest value of the layer thickness thus obtained is greater than or equal to the minimum layer thickness specified for this material. In FIG. 10C, by way of example, the value 5 nm was chosen as a specified minimum layer thickness for molybdenum (Mo). This procedure is possible since a constant layer having the thickness of 20 nm or else 100 nm or else 500 nm does not influence the wavefront profile significantly in this context.

FIG. 10D shows the computational layer thickness profile $d_2'$ [nm] of the transmission correction layer obtained by solving the equation system. Positive and also negative layer thicknesses once again occur in this case. If, by way of example, 20 nm is chosen as value for the specified minimum layer thickness of silicon, then this results in the implementable layer thickness profile $d_2$ [nm] of the transmission correction layer illustrated in FIG. 10E.

The thickness profile of the multilayer of the film element is shown in FIG. 10F: an upper, rather thicker, varying layer of silicon is applied on a lower, rather thinner, varying layer of molybdenum. The complementary behavior of the thicknesses of the two layers is readily discernible at the locations x=0.75 and x=0.5. The two layers can also be interchanged, that is to say that the thinner layer of molybdenum can also be applied on the thicker layer of silicon.

FIG. 10G shows the deviation ΔWF of the wavefront profile predefined in FIG. 10A from that wavefront profile which was produced using the multilayer film of a film element described in FIG. 10F. The deviation is constant and thus optically neutral.

FIG. 10H illustrates the transmission profile of the multilayer of the film element described with reference to FIG. 10F. This transmission profile, as predefined initially, has no variation. The transmission T of approximately 83.6% illustrated here takes account only of the two layers illustrated in FIG. 10F. As already explained, a film element can comprise even further layers or else supporting structures which can additionally decrease the transmission.

The invention claimed is:

1. Projection lens (PO) for imaging a pattern arranged in an object plane (OS) of the projection lens into an image plane (IS) of the projection lens with electromagnetic radiation having a working wavelength λ from the extreme ultraviolet range (EUV) comprising:
   a plurality of mirrors having mirror surfaces which are arranged in a projection beam path between the object plane and the image plane such that a pattern arranged in the object plane is imaged into the image plane by the mirrors, and
   a wavefront correction device (WFC) comprising a transmissive film element having a film which is arranged in the projection beam path in an operating mode of the wavefront correction device and is configured to transmit a predominant proportion of the EUV radiation impinging on an optical used region of the film through the transmissive film element at the working wavelength λ, wherein the film element comprises:
   a first continuous layer (L1), which consists of a first layer material having a first complex refractive index $n_1=(1-\delta_1)+i\beta_1$ and has a first optical layer thickness which varies locally over the used region in accordance with a first layer thickness profile; and
   a second continuous layer (L2), which consists of a second layer material having a second complex refractive index $n_2=(1-\delta_2)+i\beta_2$ and has a second optical layer thickness which varies locally over the used region in accordance with a second layer thickness profile,
   wherein the first layer thickness profile differs from the second layer thickness profile, and
   wherein $\delta_1$ is a parameter representing a deviation of the real part of the first refractive index from 1 and is larger than $\beta_1$, which is a parameter representing an absorption coefficient of the first layer material,
   wherein $\delta_2$ is a parameter representing a deviation of the real part of the second refractive index from 1 and is smaller than $\beta_2$, which is a parameter representing an absorption coefficient of the second layer material, and
   wherein the projection beam path enters the transmissive film element via a radiation entrance side and exits the transmissive film element via a radiation exit side opposite the radiation entrance side.

2. Projection lens according to claim 1, wherein the film element is arranged in the projection beam path such that all rays of the projection beam are incident on the optical used region with angles of incidence of less than 20°.

3. Projection lens according to claim 1, wherein the film element has a transmittance of at least 70% for the impinging EUV radiation in an entirety of the optical used region.

4. Projection lens according to claim 1,
wherein the projection lens has at least one pupil plane between the object plane and the image plane and
wherein the film element is arranged in the pupil plane or optically in proximity to the pupil plane.

5. Projection lens according to claim 1, wherein at least one of:
the projection lens has a film element in optical proximity to the object plane or the image plane and
an intermediate image plane lies between the object plane and the image plane and a film element is arranged in the intermediate image plane or in optical proximity to the intermediate image plane.

6. Projection lens according to claim 1, wherein the film element comprises a multilayer film comprising the first layer and the second layer.

7. Projection lens according to claim 1, wherein the first layer is mounted on a first film and the second layer is mounted on a second film of the film element, said second film being physically separate from the first film.

8. Projection lens according to claim 7, wherein at least one of:
a geometrical distance between the first film and the second film is less than ten centimeters, and
an optical distance between the first film and the second film is dimensioned such that subaperature ratios of the first and second films deviate from one another by less than 0.05.

9. Projection lens according to claim 1, wherein at least one of:
the working wavelength is between 5 nm and 20 nm,
a first efficiency ratio $V_1=\delta_1/\beta_1$ is greater than 5, and
a second efficiency ratio $V_2=\delta_2/\beta_2$ is less than 0.6.

10. Projection lens according to claim 1, wherein a first efficiency ratio $V_1=\delta_1/\beta_1$ and a second efficiency ratio $V_2=\delta_2/\beta_2$ and
wherein a ratio $V_1/V_2$ is greater than 2.

11. Projection lens according to claim 1, wherein the working wavelength is in a wavelength range of 7 nm to 20 nm and
wherein at least one of:
the first layer material is selected from the group: ruthenium (Ru), zirconium (Zr), molybdenum (Mo), niobium (Nb), chromium (Cr), beryllium (Be), gold (Au), yttrium (Y), yttrium silicide ($Y_5Si_3$), zirconium silicide ($ZrSi_2$), or from a material composition which predominantly consists of one of said first-layer materials, and
the second layer material is selected from the group silicon (Si) and germanium (Ge) or a material composition which predominantly consists of one of said second-layer materials.

12. Projection lens according to claim 1, wherein the working wavelength is in a wavelength range of 6 nm to 7 nm and
wherein at least one of:
the first layer material is selected from the group: $NbOB_4C$, $NbO_2$, $Nb_2O_5$, $RuO_4$, $MoO_2$, $Rh_2O_3$, C, Te, In, Ba, Sn, $RuO_2$, $MoO_3$, La, B, $B_4C$, BN, $ZrO_2$ or from a material composition which predominantly consists of one of said first-layer materials, and the second layer material is selected from the group Y or Rb or a material composition which predominantly consists of one of said second-layer materials.

13. Projection lens according to claim 1, wherein at least one of:
a first PV ratio between a largest local value and a smallest local value of the first optical layer thickness in the optical used region is between 2 and 6, and
a second PV ratio between a largest local value and a smallest local value of the second optical layer thickness in the optical used region is between 2 and 6.

14. Projection lens according to claim 1, wherein the second layer thickness profile is complementary to the first layer thickness profile.

15. Projection lens according to claim 1, wherein the layer thicknesses of the first layer and of the second layer are such that the film, in a region of maximum wavefront change, brings about a wavefront change of at least 3% of the working wavelength.

16. Projection lens according to claim 1, wherein the second layer thickness is greater than the working wavelength at at least one position in the optical used region.

17. Projection lens according to claim 1, wherein the first layer has in the optical used region an asymmetrical first layer thickness profile having neither a mirror symmetry nor a radial symmetry or a rotational symmetry.

18. Projection lens according to claim 1, wherein the film has a first film surface, a second film surface and a film thickness, measured between the first and second film surfaces, of less than 1 μm, wherein the film thickness is 300 nm or less.

19. Projection lens according to claim 1, wherein the film has at at least one film surface an outer protective layer consisting of a protective layer material that is more resistant to ambient influences than is an inner layer directly adjacent to the protective layer.

20. Projection lens according to claim 1, wherein the film comprises only a single first layer, only a single second layer, or only a single first and a single second layer.

21. Projection lens according to claim 1, wherein the film element comprises a multilayer film comprising at least one antireflection layer which has a reflection-reducing effect for the working wavelength.

22. Projection lens according to claim 1, wherein at least one intermediate layer is arranged between the first layer and the second layer, and wherein the intermediate layer is at least one of: an antireflection layer and a diffusion barrier layer.

23. Projection lens according to claim 1, wherein the film element comprises a multilayer film comprising fewer than 10 further layers in addition to the first layer and the second layer.

24. Projection lens according to claim 1,
wherein at least one of the first layer and the second layer is constructed with a heterogeneous layer structure, and
wherein the first layer is molybdenum-based and has an inner layer structure in which relatively thick partial layers composed of molybdenum are separated by a relatively thin crystallization stop layer.

25. Projection lens according to claim 1, wherein the optical used region has a smallest diameter of at least 50 mm.

26. Projection lens according to claim 1, wherein the film element has a lattice-like supporting structure which, in the optical used region, is in contact with and stabilizes the film, and which has struts that form polygonal openings.

27. Projection lens according to claim 1, wherein the film element has a frame that supports the film to be self-supporting in the optical used region.

28. Projection lens according to claim 1, further comprising a holding structure retaining the mirrors at predetermined respective positions in the projection beam path, and
wherein the film element is arranged on a changeable holder, which is movable relative to the holding structure, such that the film element is arranged optionally in the projection beam path or outside the projection beam path by movement of the changeable holder.

29. The projection lens according to claim 7, wherein the second film is arranged at a position that is optically conjugate with respect to a position of the first film.

30. Projection lens according to claim 1, wherein the working wavelength is 13.5 nm.

31. Film element, comprising:
a transmissive film, which is configured to transmit a predominant proportion of EUV radiation impinging on an optical used region of the film through the film, at a working wavelength λ from the extreme ultraviolet range (EUV), wherein the film comprises:
a first continuous layer, which consists of a first layer material having a first complex refractive index $n_1=(1-\delta_1)+i\beta_1$ and has a first optical layer thickness which varies locally over the used region in accordance with a first layer thickness profile; and
a second continuous layer, which consists of a second layer material having a second complex refractive index $n_2=(1-\delta_2)+i\beta_2$ and has a second optical layer thickness which varies locally over the used region in accordance with a second layer thickness profile,
wherein the first layer thickness profile differs from the second layer thickness profile, and
wherein $\delta_1$ is a parameter representing a deviation of the real part of the first refractive index from 1 and is larger than $\beta_1$, which is a parameter representing an absorption coefficient of the first layer material,
wherein $\delta_2$ is a parameter representing a deviation of the real part of the second refractive index from 1 and is smaller than $\beta_2$, which is a parameter representing an absorption coefficient of the second layer material, and
wherein a beam path of the EUV radiation enters the transmissive film via a radiation entrance side and exits the transmissive film via a radiation exit side opposite the radiation entrance side.

32. Film element according to claim 31, wherein the film element has a transmittance of between 70% and 90% for the impinging EUV radiation in the entire optical used region.

33. Film element according to claim 31, wherein the working wavelength is 13.5 nm.

34. Projection lens (PO) for imaging a pattern arranged in an object plane (OS) of the projection lens into an image plane (IS) of the projection lens with electromagnetic radiation from the extreme ultraviolet range (EUV) around a working wavelength λ, comprising:
a plurality of mirrors having mirror surfaces which are arranged in a projection beam path between the object plane and the image plane such that a pattern arranged in the object plane is imaged into the image plane by the mirrors, wherein rays of a projection beam that run between the object plane and the image plane form a wavefront, and
a wavefront correction device (WFC) comprising a transmissive film element which is arranged in the projection beam path in at least one operating mode of the wavefront correction device and is configured to transmit a predominant proportion of the EUV radiation impinging on the film element in an optical used region of the film element through the transmissive film,
wherein the projection beam path enters the transmissive film element via a radiation entrance side and exits the transmissive film element via a radiation exit side opposite the radiation entrance side, and
wherein the transmissive film element is configured to alter the wavefront such that the wavefront leading to image formation in the image plane, when the film element is present in the projection beam path, is closer to a predetermined profile of the wavefront than when the film element is absent from the projection beam path.

35. Projection lens according to claim 34, wherein the film element is arranged in the projection beam path such that all rays of the projection beam are incident on the optical used region with angles of incidence of less than 10°.

36. Projection lens according to claim 34, wherein at least one pupil plane lies between the object plane and the image plane and wherein the film element is arranged in the pupil plane or optically in proximity to the pupil plane.

37. Projection lens according to claim 34, wherein the working wavelength is 13.5 nm.

38. Projection lens (PO) for imaging a pattern arranged in an object plane (OS) of the projection lens into an image plane (IS) of the projection lens with electromagnetic radiation from the extreme ultraviolet range (EUV) around a working wavelength λ, comprising:
a plurality of mirrors having mirror surfaces which are arranged in a projection beam path between the object plane and the image plane such that a pattern arranged in the object plane is imaged into the image plane with the mirrors, wherein rays of a projection beam that run between the object plane and the image plane form a wavefront,
a first film comprising a first film substrate and a first continuous layer having a first optical layer thickness which varies locally over a used region of the first layer, wherein the projection beam path enters the first film via a first radiation entrance side and exits the first film via a first radiation exit side opposite the first radiation entrance side, and a second film comprising a second film substrate and a second continuous layer having a second optical layer thickness which varies locally over a used region of the second layer, which second film is configured to mount in the projection lens independently of the first film, wherein the projection beam path enters the second film via a second radiation entrance side and exits the second film via a second radiation exit side opposite the first radiation entrance side,
wherein each of the respective films, at a working wavelength λ from the extreme ultraviolet range, transmits a predominant proportion of the EUV radiation impinging on the respective film in the respective used regions of the first and second layers through the respective film.

39. Projection lens according to claim 38, wherein at least one pupil plane lies between the object plane and the image plane and wherein the first film and/or the second film is arranged in the pupil plane or optically in proximity to the pupil plane.

40. Projection lens according to claim 38, wherein the working wavelength is 13.5 nm.

* * * * *

UNITED STATES PATENT AND TRADEMARK OFFICE
CERTIFICATE OF CORRECTION

PATENT NO. : 10,001,631 B2
APPLICATION NO. : 14/454939
DATED : June 19, 2018
INVENTOR(S) : Bittner et al.

Page 1 of 1

It is certified that error appears in the above-identified patent and that said Letters Patent is hereby corrected as shown below:

In the Specification

Column 6, Line 55, Delete "Vi=δi/βi," and insert -- Vi=δi/βi --, therefor.

Column 6, Line 64, Delete "V2=δ2/δ2" and insert -- V2=δ2/β2 --, therefor.

Column 15, Line 63, Delete "objet" and insert -- object --, therefor.

Column 17, Line 10, Delete "1a," and insert -- 1A, --, therefor.

Column 17, Line 62, Delete "δ2." and insert -- ß2. --, therefor.

Column 19, Lines 47-48, Delete "ß1=13(Mo)" and insert -- ß1=ß(Mo) --, therefor.

Column 25, Line 2, Delete "2012)" and insert -- 2012). --, therefor.

Signed and Sealed this
Thirtieth Day of July, 2019

Andrei Iancu
*Director of the United States Patent and Trademark Office*